US012696620B2

(12) United States Patent
Lee et al.

(10) Patent No.: US 12,696,620 B2
(45) Date of Patent: Jul. 28, 2026

(54) DISPLAY DEVICE

(71) Applicant: Samsung Display Co., Ltd., Yongin-Si (KR)

(72) Inventors: Kwang Soo Lee, Gwangmyeong-si (KR); Seul Ki Kim, Incheon (KR); Seung Rae Kim, Cheonan-si (KR); Jae Hyun Lee, Gwacheon-si (KR); Seung Ha Choi, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 793 days.

(21) Appl. No.: 17/568,504

(22) Filed: Jan. 4, 2022

(65) Prior Publication Data

US 2022/0392966 A1 Dec. 8, 2022

(30) Foreign Application Priority Data

Jun. 3, 2021 (KR) ........................ 10-2021-0072031

(51) Int. Cl.
  *H10K 59/12* (2023.01)
  *H10K 59/121* (2023.01)
  *H10K 59/35* (2023.01)
(52) U.S. Cl.
  CPC ....... *H10K 59/1213* (2023.02); *H10K 59/353* (2023.02); *H10K 59/12* (2023.02)
(58) Field of Classification Search
  CPC .. H10K 50/844; H10K 59/873; H10K 77/111; H10K 59/129; H10K 2102/311; H10K 2102/361; H10K 50/11; H10K 50/15; H10K 50/16; H10K 50/171; H10K 2101/30; H10K 2101/40; H10K 2102/351; H10K 50/852; H10K 59/35; H10K 59/12; H10K 50/156; H10K 2101/00; H10K 59/131; H10K 50/805; H10K 50/856; H10K 50/8445; H10K 50/85; H10K 59/10; H10K 71/00; H10K 59/353; H10K 59/1213;
(Continued)

(56) References Cited

U.S. PATENT DOCUMENTS

2016/0197295 A1* 7/2016 Lee ........................ H10K 10/88
                                                            438/155
2017/0104046 A1* 4/2017 Seo ...................... H10D 86/441
(Continued)

FOREIGN PATENT DOCUMENTS

KR    10-20170079376 A    7/2017
KR    10-20190063230 A    6/2019
(Continued)

*Primary Examiner* — Moin M Rahman
(74) *Attorney, Agent, or Firm* — Innovation Counsel LLP

(57) ABSTRACT

Provided is a display device which comprises a substrate, a first insulating layer disposed on the substrate, a semiconductor layer disposed on the first insulating layer, wherein the semiconductor layer includes an active pattern, a second insulating layer disposed on the semiconductor layer, and a first conductive layer disposed on the second insulating layer. The display device further comprises a gate electrode and source/drain electrodes composed of the same conductive layer, and comprises a semiconductor layer having reduced resistance against an electrical signal applied to the transistor. Thus, reliability of the display device is improved due to the decrease in the resistance of the semiconductor layer.

20 Claims, 22 Drawing Sheets

201: 210, 231a

201: 231a, 231b

(58) Field of Classification Search
CPC ............... H10K 59/121; H10K 59/124; H10K
599/1213; G02F 1/133388; G02F
1/13452; G02F 1/136254; G02F 2201/50;
G02F 1/133305; G02F 2202/28; H01L
2224/73204; H01L 27/124; H01L 33/382;
H01L 33/387; H01L 33/504; H01L
33/507; H01L 25/0753; H01L 27/156;
H01L 33/56; H01L 33/62; H01L
2224/48091; H01L 2224/48137; H01L
33/647; H01L 33/486; H01L 2224/45144;
H01L 33/54; H01L 33/641; H01L 33/60;
H01L 25/167; H01L 27/15; H01L 27/32;
H01L 27/3202; H01L 27/3204; H01L
27/3209; H01L 27/3225; H01L 27/3251;
H01L 27/3258; H01L 51/50; H01L
51/525; H01L 51/5287; H01L 2227/32;
H01L 2227/326; H01L 2251/5323; H01L
2251/5338; H01L 2251/5353; H01L
2251/56; H01L 2251/566; H01L
29/12041; H01L 29/12044; H01L
33/52–56; H01L 51/448; H01L 51/5209;
H01L 27/3262; H01L 27/3248; H01L
27/322; H01L 51/5225; H01L 51/5268;
H01L 2251/558; H01L 2251/303; H01L
2251/306; H01L 2251/308; H01L
51/5218; H01L 51/5271; H01L 51/5275;
H01L 51/0005; H01L 51/5012; H01L
51/5206; H01L 51/5221; H01L 51/56;
H01L 27/3244; H01L 2227/323; B60K
2370/1523; B60K 2370/331; B60K
2370/52; B60K 37/02; B60R 1/00; Y02E
10/549; G09G 2300/0426; H10D 86/441
See application file for complete search history.

(56) References Cited

U.S. PATENT DOCUMENTS

| | | | |
|---|---|---|---|
| 2019/0001989 A1 | 1/2019 | Schoenfeld et al. | |
| 2020/0212026 A1* | 7/2020 | Son | H01L 27/156 |
| 2021/0066423 A1* | 3/2021 | Lee | H10K 59/40 |

FOREIGN PATENT DOCUMENTS

| | | | |
|---|---|---|---|
| KR | 10-20200032405 A | 3/2020 | |
| KR | 10-2020-0081223 A | 7/2020 | |

* cited by examiner

FIG. 1
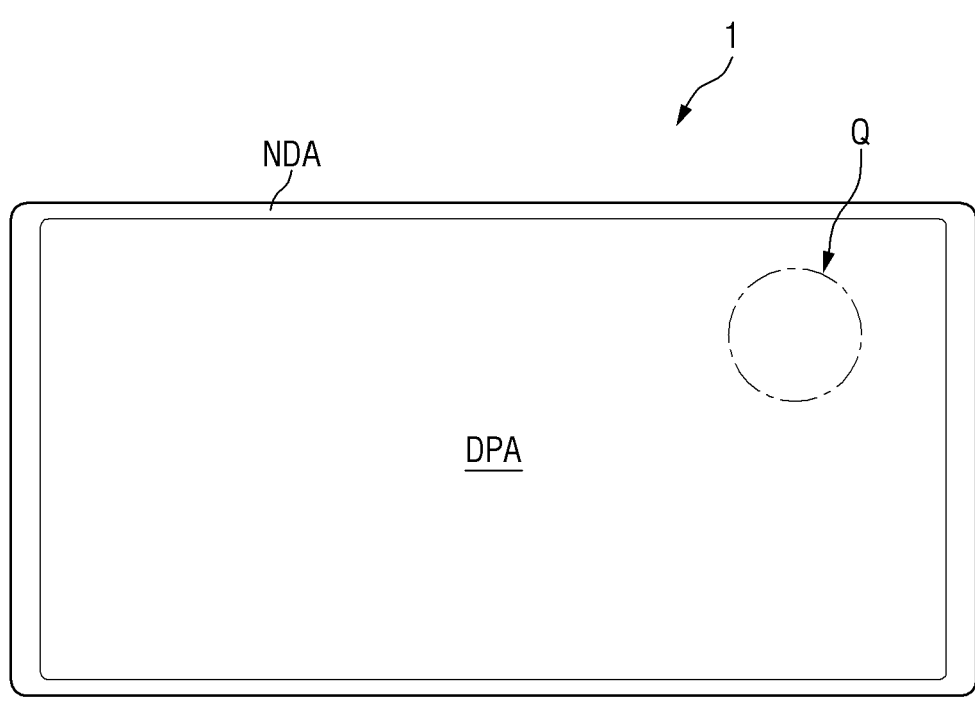
NDA
1
Q
DPA
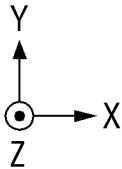

FIG. 4
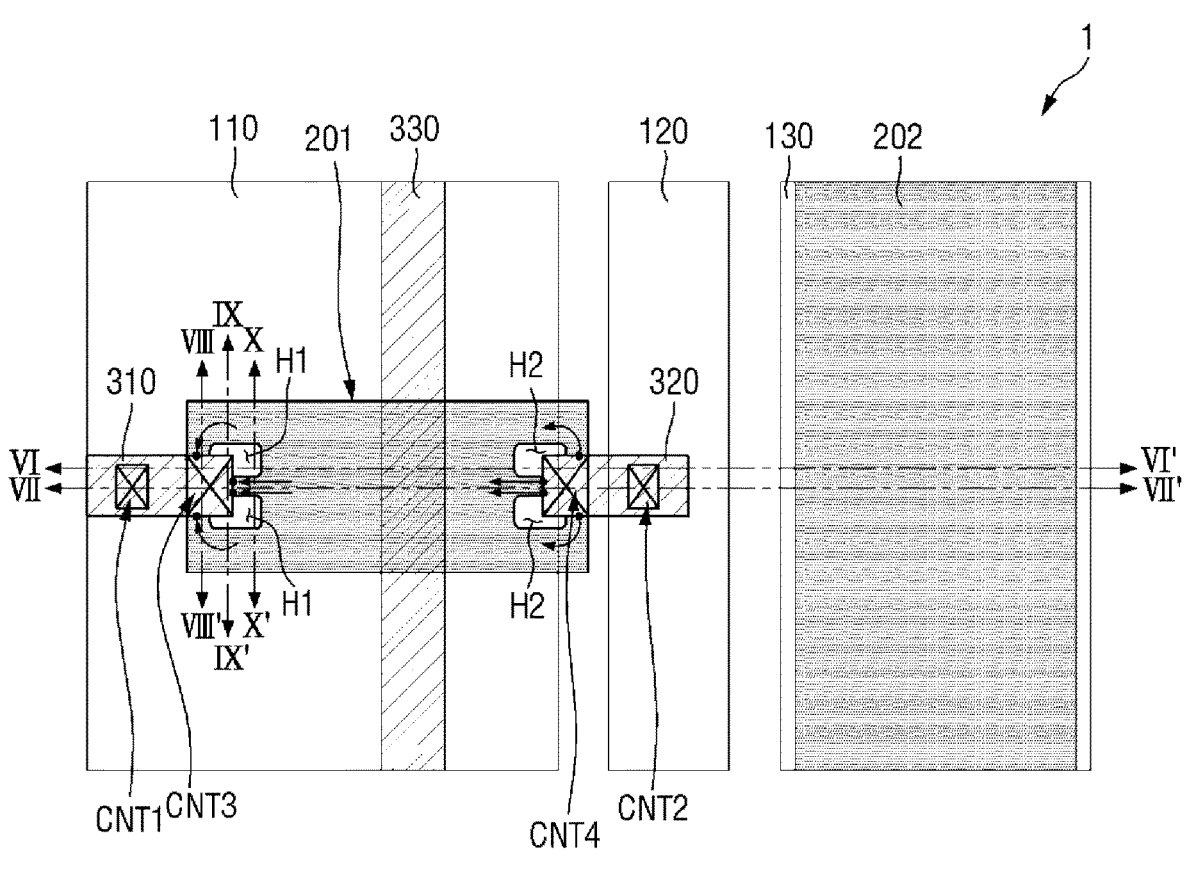
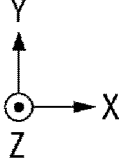
100: 110, 120, 130
200: 201, 202
300: 310, 320, 330

FIG. 6
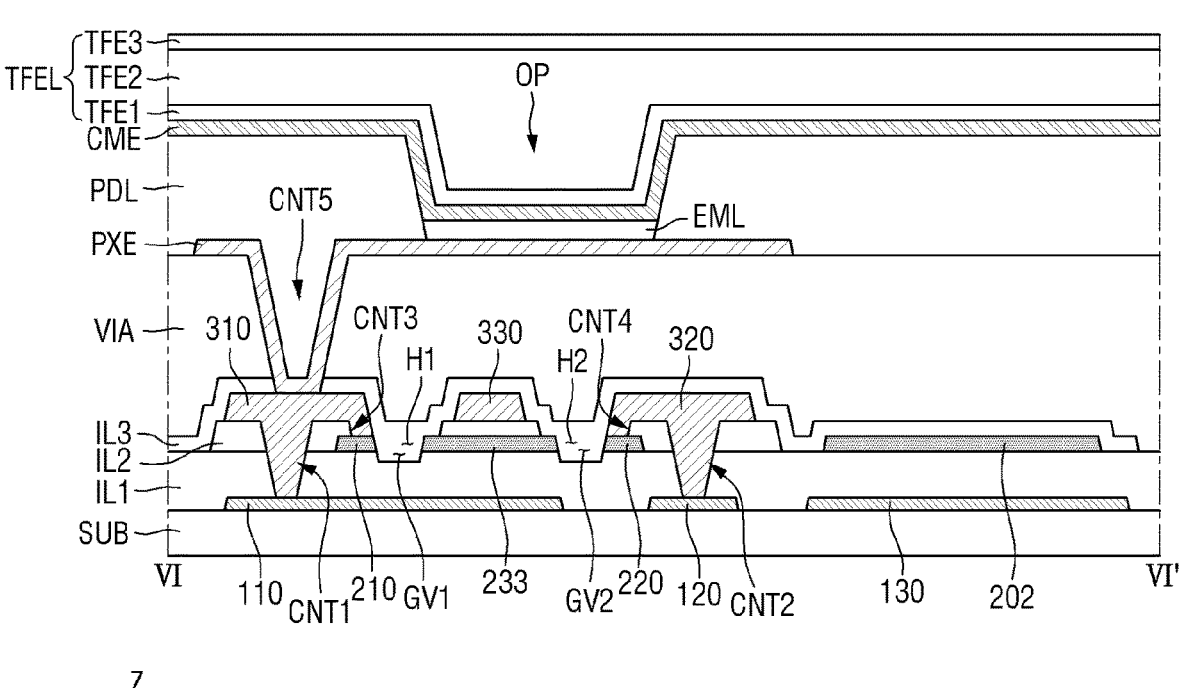
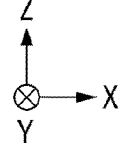
201: 210, 220, 233
EMD: PXE, EML, CME

201: 210, 220, 233
EMD: PXE, EML, CME

201: 210, 231a

201: 210, 231a

FIG. 10
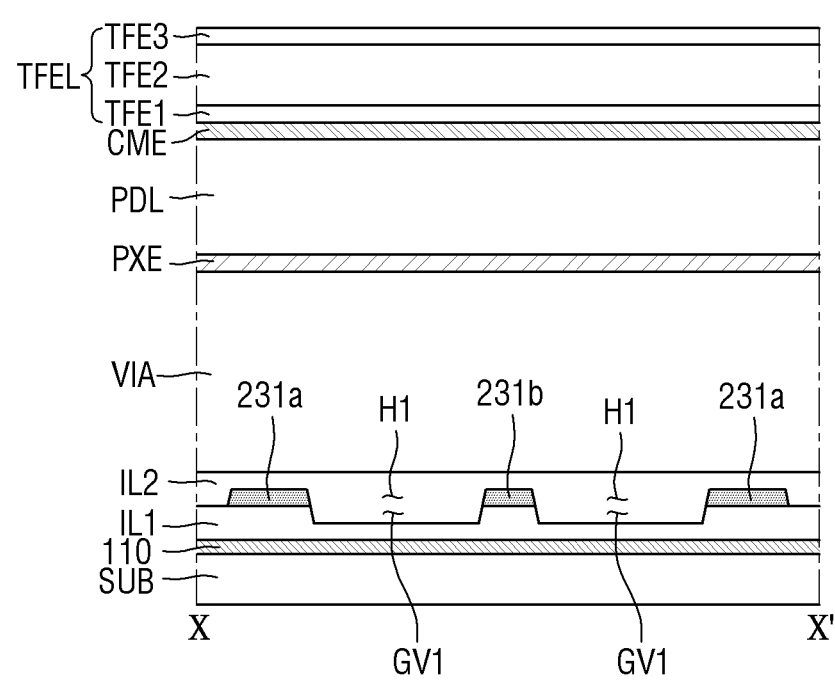
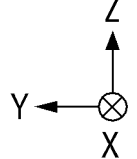
201: 231a, 231b

FIG. 11

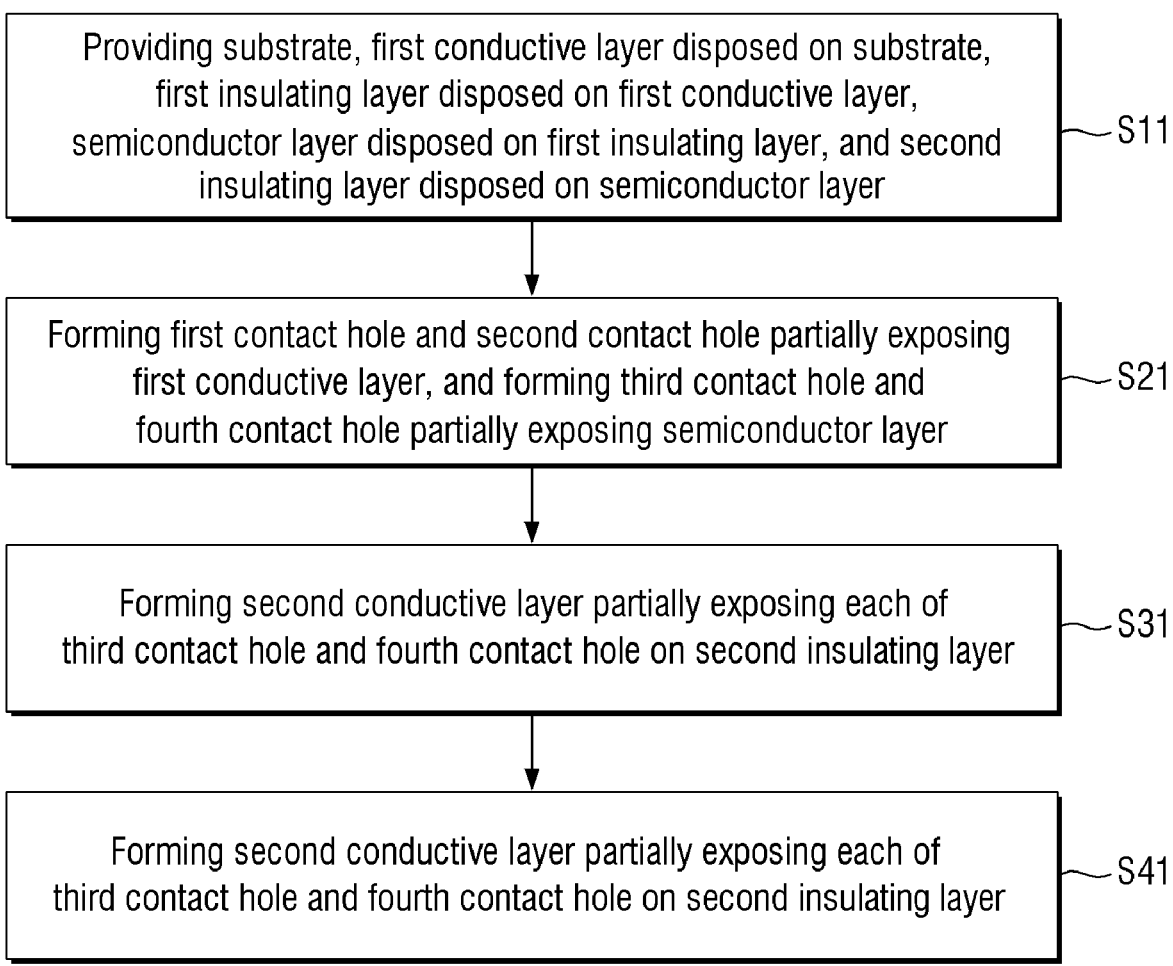

Providing substrate, first conductive layer disposed on substrate, first insulating layer disposed on first conductive layer, semiconductor layer disposed on first insulating layer, and second insulating layer disposed on semiconductor layer — S11

Forming first contact hole and second contact hole partially exposing first conductive layer, and forming third contact hole and fourth contact hole partially exposing semiconductor layer — S21

Forming second conductive layer partially exposing each of third contact hole and fourth contact hole on second insulating layer — S31

Forming second conductive layer partially exposing each of third contact hole and fourth contact hole on second insulating layer — S41

FIG. 12
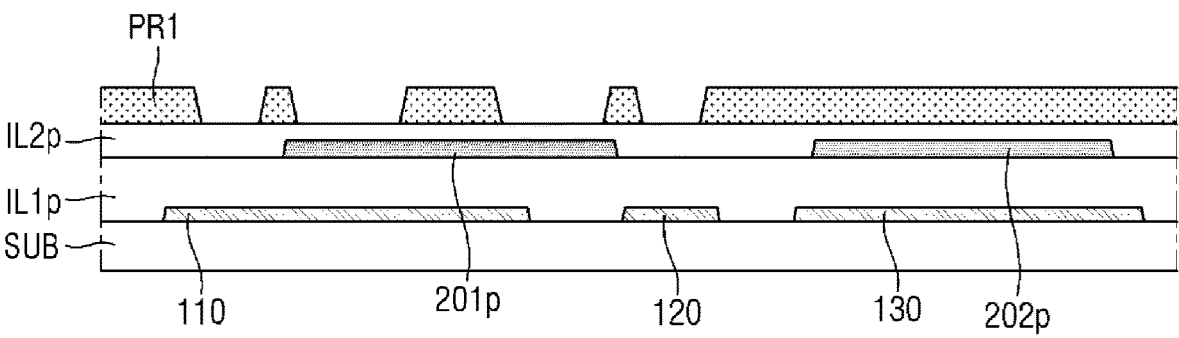
PR1
IL2p
IL1p
SUB
110      201p      120      130      202p
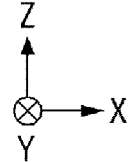
200p: 201p, 202p

FIG. 13
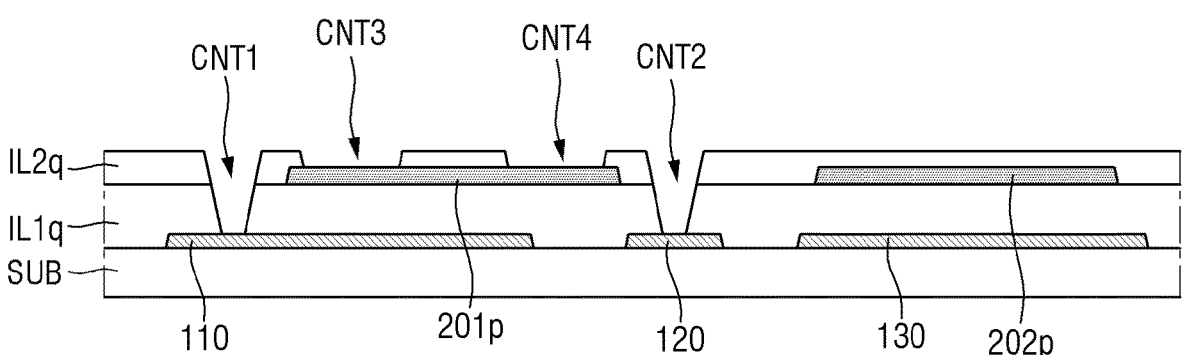
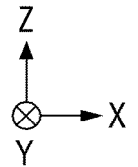
200p: 201p, 202p

FIG. 14
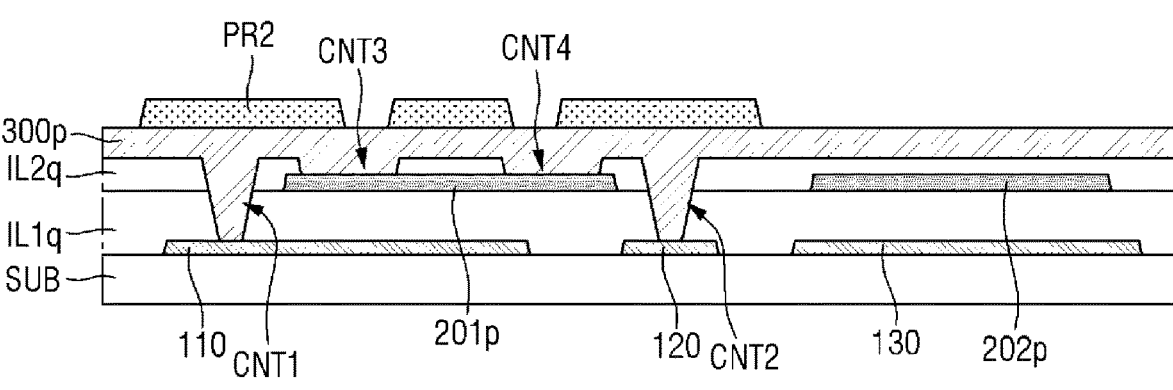
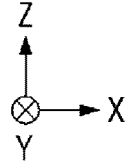
200p: 201p, 202p

FIG. 15
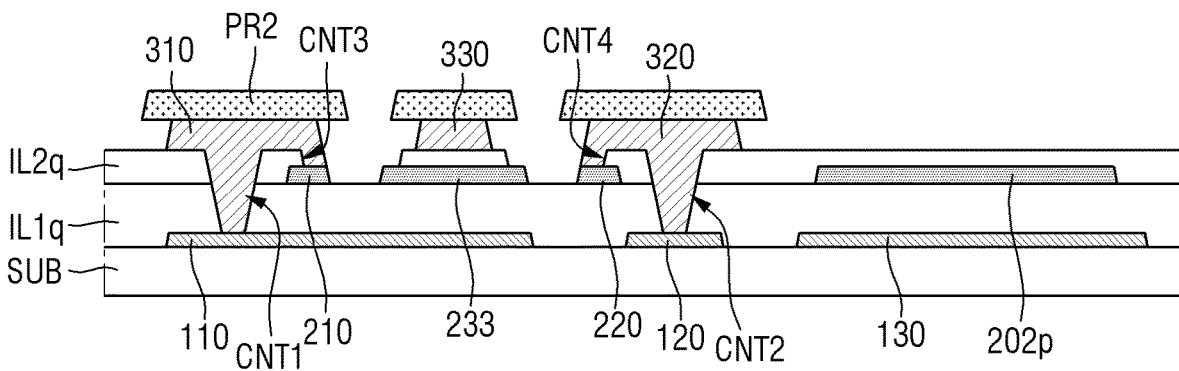
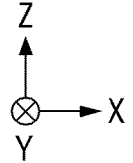
201: 210, 220, 233

FIG. 16
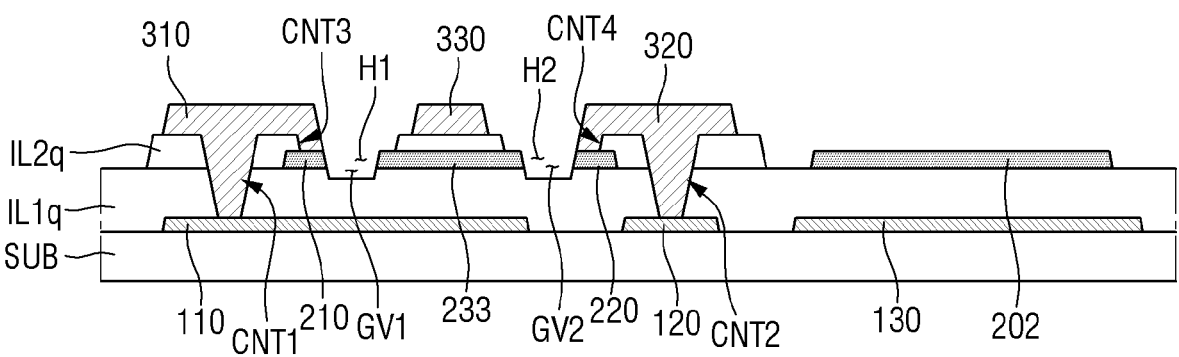
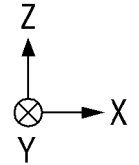
201: 210, 220, 233

FIG. 17
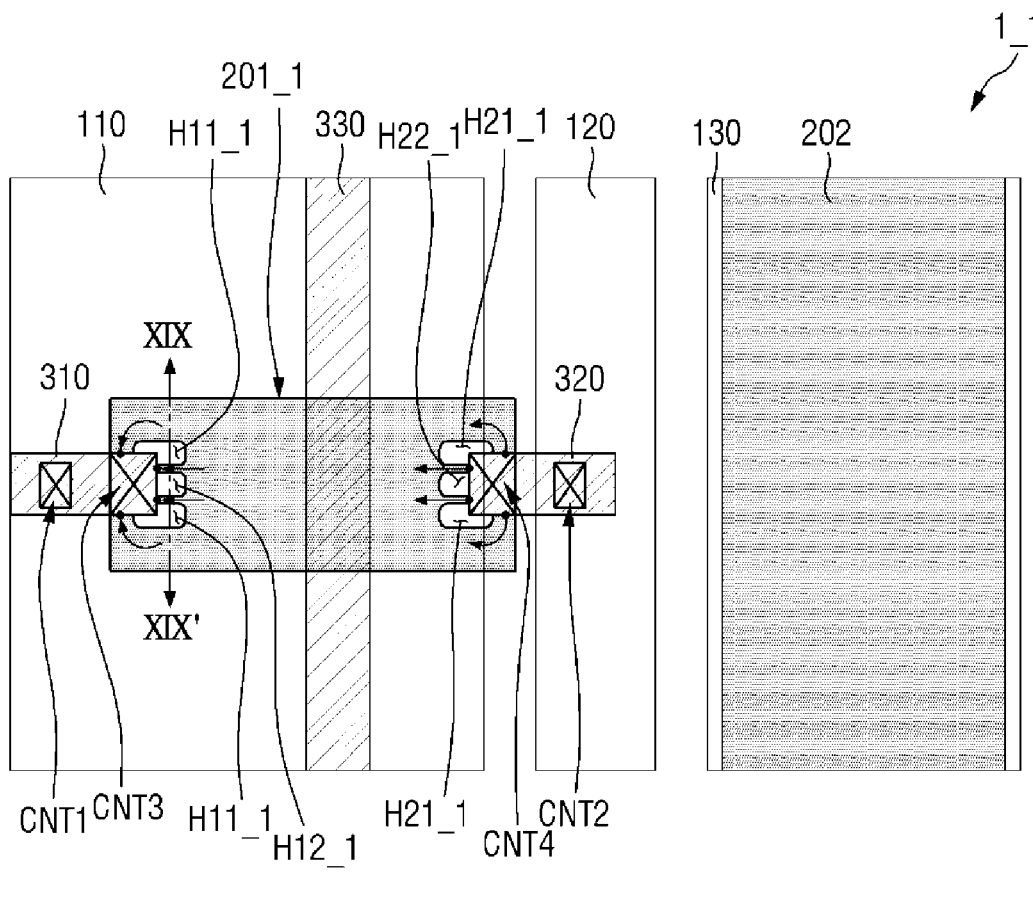
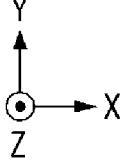
100: 110, 120, 130
200_1: 201_1, 202
300: 310, 320, 330

FIG. 18
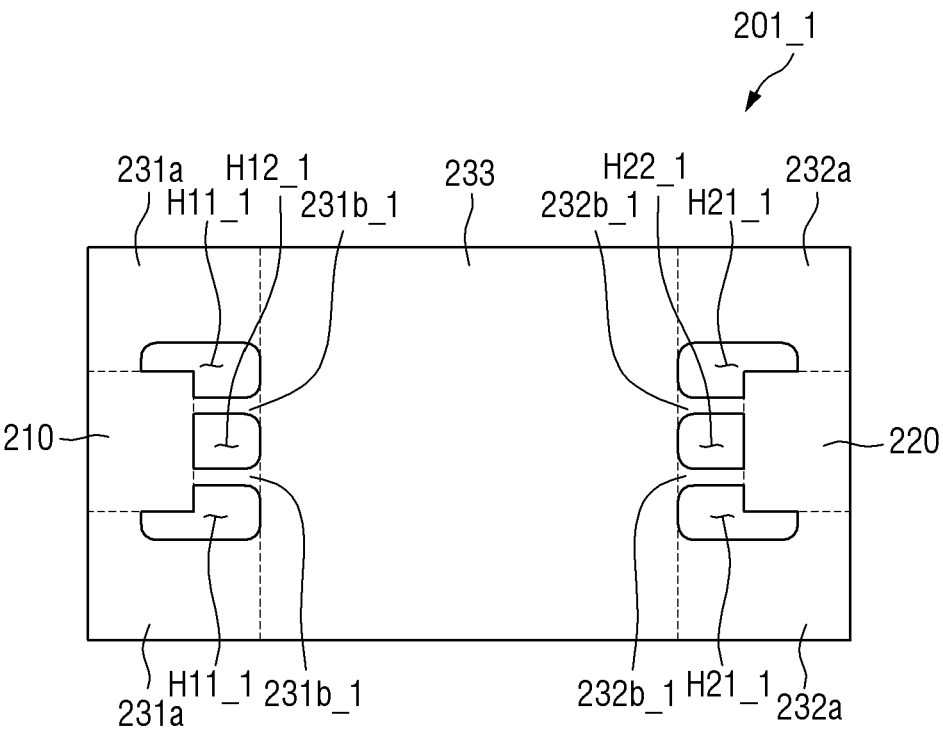
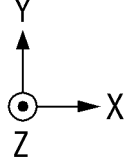
230_1: 231_1, 232_1, 233
231_1: 231a, 231b_1
232_1: 232a, 232b_1

100: 110, 120, 130
200: 201, 202
300: 310, 320, 330

200: 201, 202
201: 210, 220, 233
EMD: PXE, EML, CME

200: 201, 202
201: 210, 220, 233
EMD: PXE, EML, CME

DISPLAY DEVICE

CROSS-REFERENCE TO RELATED APPLICATION

This application claims priority from Korean Patent Application No. 10-2021-0072031 filed on Jun. 3, 2021, in the Korean Intellectual Property Office, and all the benefits accruing therefrom under 35 U. S. C. 119, the contents of which in its entirety are herein incorporated by reference.

BACKGROUND

1. Field

The present disclosure generally relates to a display device. More particularly, the present disclosure relates to a display device to improve reliability of the display device.

2. Description of Related Art

Importance of a display device is increasing under development of multimedia. Thus, various types of the display devices such as an organic light-emitting display device (OLED), a liquid crystal display device (LCD), etc. are being used. Applications of the display devices are being diversified. For example, the display devices are applied to various electronic products, for example, TVs, smart phones, smart watches, and tablet PCs.

The display device may include a plurality of transistors. Each transistor may include a gate electrode, source/drain electrodes, and a semiconductor layer. In order to simplify a manufacturing process of the display device, the gate electrode and the source/drain electrodes included in the display device may be composed of the same conductive layer.

SUMMARY

A purpose of the present disclosure is to provide a display device including a transistor having a gate electrode and source/drain electrodes composed of the same conductive layer, and having a semiconductor layer having reduced resistance against an electrical signal applied to the transistor. Thus, reliability of the display device is improved due to the decrease in the resistance of the semiconductor layer.

Purposes according to the present disclosure are not limited to the above-mentioned purpose. Other purposes and advantages according to the present disclosure that are not mentioned may be understood based on following descriptions, and may be more clearly understood based on embodiments according to the present disclosure. Further, it will be easily understood that the purposes and advantages according to the present disclosure may be realized using means shown in the claims and combinations thereof.

According to an embodiment of the disclosure, a display device comprises a substrate, a first insulating layer disposed on the substrate, a semiconductor layer disposed on the first insulating layer, wherein the semiconductor layer includes an active pattern, a second insulating layer disposed on the semiconductor layer, and a first conductive layer disposed on the second insulating layer. The first conductive layer comprises a first electrode in contact with the active pattern, and a second electrode facing the first electrode and in contact with the active pattern. The active pattern comprises a first area in contact with the first electrode, a second area in contact with the second electrode, a third area disposed between the first area and the second area, a plurality of first holes disposed between the first area and the third area, and a plurality of second holes disposed between the second area and the third area. The first insulating layer comprises a first groove overlapping the first hole and having a top face recessed toward the substrate, and a second groove overlapping the second hole and having a top face recessed toward the substrate.

A direction in which the plurality of first holes are arranged may be the same as a direction in which the plurality of second holes are arranged.

The third area may comprise a first sub-area disposed between first holes adjacent to each other among the plurality of first holes, and a second sub-area disposed between second holes adjacent to each other among the plurality of second holes. The first sub-area may non-overlap the first groove. The second sub-area may non-overlap the second groove.

A portion of an edge of the first sub-area may be aligned with an edge of the first groove. A portion of an edge of the second sub-area may be aligned with an edge of the second groove.

The first sub-area may comprise a plurality of first sub-areas, and the second sub-area may comprise a plurality of second sub-areas.

The first electrode may be in contact with the first area of the active pattern through a first contact hole penetrating the second insulating layer. The second electrode may be in contact with the second area of the active pattern through a second contact hole penetrating the second insulating layer.

The device may further comprise a second conductive layer disposed between the substrate and the first insulating layer. The second conductive layer may comprise a first pattern in contact with the first electrode, and a second pattern in contact with the second electrode.

The first electrode and the first pattern may contact each other through a third contact hole penetrating the first insulating layer and the second insulating layer. The second electrode and the second pattern may contact each other through a fourth contact hole penetrating the first insulating layer and the second insulating layer.

The first contact hole may be disposed between the first groove and the third contact hole. The second contact hole may be disposed between the second groove and the fourth contact hole.

The first contact hole may be spatially connected to the third contact hole. The second contact hole may be spatially connected to the fourth contact hole.

The second conductive layer may further comprise a first storage pattern spaced apart from the second pattern. The semiconductor layer may further comprise a second storage pattern overlapping the first storage pattern.

The first contact hole may be spatially connected to the first groove. The second contact hole may be spatially connected to the second groove.

According to an embodiment of the disclosure, a display device comprises a substrate, an active pattern disposed on the substrate, a first electrode disposed on the substrate and partially overlapping the active pattern, anda second electrode disposed on the substrate and facing to the first electrode, wherein the second electrode partially overlaps the active pattern. The active pattern comprises a plurality of first holes, wherein a portion of an edge of each of the plurality of first holes is aligned with an edge of the first electrode, and a plurality of second holes, wherein a portion of an edge of each of the plurality of second holes is aligned with an edge of the second electrode.

A direction in which the plurality of first holes are arranged may be the same as a direction in which the plurality of second holes are arranged.

The device may further comprise a first insulating layer disposed between the active pattern and the first electrode. The first electrode may be in contact with the active pattern through a first contact hole penetrating the first insulating layer.

The device may further comprise a second insulating layer disposed between the substrate and the active pattern. The second insulating layer may comprise a first groove overlapping the first hole and having a top face recessed toward the substrate, and a second groove overlapping the second hole and having a top face recessed toward the substrate.

The active pattern may further comprise a first area overlapping the first electrode, a second area overlapping the second electrode, and a third area disposed between the first area and the second area. The plurality of first holes may be disposed between the first area and the third area. The plurality of second holes may be disposed between the second area and the third area.

The third area may comprise a first sub-area disposed between first holes adjacent to each other among the plurality of first holes, anda second sub-area disposed between second holes adjacent to each other among the plurality of second holes.

The first sub-area may include a plurality of first sub-areas, and the second sub-area includes a plurality of second sub-areas.

The first electrode and the second electrode may be composed of the same conductive layer.

In the display device according to one embodiment, the transistor structure including the semiconductor layer having the plurality of holes may allow the resistance of the semiconductor layer against an electrical signal applied to the transistor to be reduced. Thus, reliability of the display device may be improved due to the decrease in the resistance of the semiconductor layer.

Effects of the present disclosure are not limited to the above-mentioned effects, and other effects as not mentioned will be clearly understood by those skilled in the art from following descriptions.

BRIEF DESCRIPTION OF DRAWINGS

The above and other aspects and features of the present disclosure will become more apparent by describing in detail example embodiments thereof with reference to the attached drawings, in which:

FIG. 1 is a schematic plan view of a display device according to one embodiment;

FIG. 4 is a plan view of a transistor included in a display device according to one embodiment;

FIG. 6 is a cross-sectional view taken along a line VI-VI' of FIG. 4;

FIG. 10 is a cross-sectional view taken along a line X-X' in FIG. 4;

FIG. 11 is a flowchart showing a method for manufacturing a display device according to one embodiment;

FIGS. 12, 13, 14, 15, and 16 are schematic diagrams showing a method for manufacturing a display device according to one embodiment;

FIG. 17 is a plan view of a transistor included in a display device according to another embodiment;

FIG. 18 is a plan view of a semiconductor pattern included in the transistor of FIG. 17;

DETAILED DESCRIPTIONS

Figure 2:
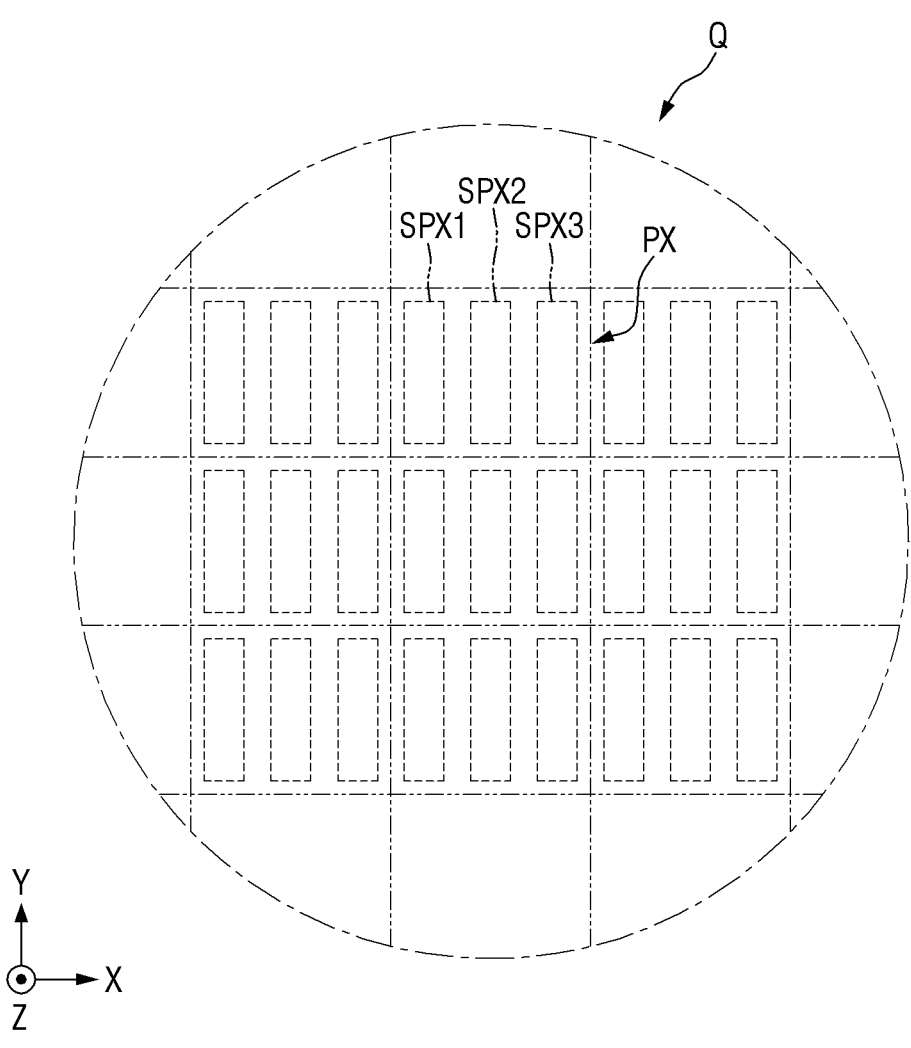
FIG. 2 is an enlarged view of a Q area of FIG. 1.

In the following description, for the purposes of explanation, numerous specific details are set forth in order to provide a thorough understanding of various embodiments or implementations of the disclosure. As used herein "embodiments" and "implementations" are interchangeable words that are non-limiting examples of devices or methods employing one or more of the disclosure disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in other embodiments without departing from the disclosure.

Unless otherwise specified, the illustrated embodiments are to be understood as providing features of varying detail of some ways in which the disclosure may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the disclosure.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc. , of the elements, unless specified.

Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements.

Further, the X-axis, the Y-axis, and the Z-axis are not limited to three axes of a rectangular coordinate system, and thus the X-, Y-, and Z-axes, and may be interpreted in a broader sense. For example, the X-axis, the Y-axis, and the Z-axis may be perpendicular to one another, or may represent different directions that are not perpendicular to one another.

For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," and the like may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e. g. , as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e. g. , rotated 90 degrees or at other orientations), and, as such, the spatially relative descriptors used herein should be interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation, not as terms of degree, and thus are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature, and the shapes of these regions may not reflect actual shapes of regions of a device and are not necessarily intended to be limiting.

As customary in the field, some embodiments are described and illustrated in the accompanying drawings in terms of functional blocks, units, parts, and/or modules. Those skilled in the art will appreciate that these blocks, units, parts, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, parts, and/or modules being implemented by microprocessors or other similar hardware, they may be programmed and controlled using software (e. g. , microcode) to perform various functions discussed herein and may optionally be driven by firmware and/or software. It is also contemplated that each block, unit, part, and/or module may be implemented by dedicated hardware, or as a combination of dedicated hardware to perform some functions and a processor (e.g., one or more programmed microprocessors and associated circuitry) to perform other functions. Also, each block, unit, part, and/or module of some embodiments may be physically separated into two or more interacting and discrete blocks, units, parts, and/or modules without departing from the scope of the disclosure. Further, the blocks, units, parts, and/or modules of some embodiments may be physically combined into more complex blocks, units, parts, and/or modules without departing from the scope of the disclosure.

Unless otherwise defined or implied herein, all terms (including technical and scientific terms) used herein have the same meaning as commonly understood by one of ordinary skill in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or overly formal sense, unless clearly so defined herein.

FIG. 1 is a schematic plan view of a display device according to one embodiment. FIG. 2 is an enlarged view of a Q area of FIG. 1.

Referring to FIG. 1 and FIG. 2, a display device 1 displays a moving image or a still image. The display device 1 may refer to any electronic device that provides a display screen. For example, the display device 1 may include a televisions, a laptop, a monitors, a billboard, an Internet of Thing, a mobile phone, a smart phone, a tablet PC (personal computer), an electronic watch, a smart watch, a watch phone, a head mounted display (HMD), a mobile communication terminal, an electronic notebook, an e-book, a PMP (Portable Multimedia Player), a navigation device, a game device, a digital camera, a camcorder, etc. which may provide a display screen.

The display device 1 includes a display panel that provides a display screen. Examples of the display panel include an inorganic light-emitting diode display panel, an organic light-emitting display panel, a quantum dot light-emitting display panel, a plasma display panel, and a field emission display panel. Hereinafter, an example in which the organic light-emitting diode display panel is embodied as the display panel will be described. However, the present disclosure is not limited thereto. When the same technical idea is applicable to other display panels, the present disclosure may also be applied to the other display panels.

A shape of the display device 1 may be variously modified. For example, the display device 1 may have a shape such as a rectangle having a long horizontal side, a rectangle having a long vertical side, a square, a rectangle with rounded corners, other polygons, or a circle. Further, a shape of the display area DPA of the display device 1 may be similar to an overall shape of the display device 1. In FIG. 1, a rectangular display device 1 in which a length in the first direction X is larger than a length in the second direction Y is illustrated.

In one embodiment, the first direction X and the second direction Y intersect each other. The first direction X may indicate an extension direction of one side of the display device 1, and the second direction Y may indicate an extension direction of an opposite side intersecting one side of the display device 1. Further, the third direction Z may refer to a direction intersecting both the first direction X and the second direction Y. However, the direction mentioned in an embodiment should be understood as referring to a relative direction. An embodiment is not limited to the mentioned direction.

The display device 1 may include a display area DPA and a non-display area NDA. The display area DPA may refer to an area where a screen is displayed, and the non-display area NDA may refer to an area where the screen is not displayed. The display area DPA may be referred to as an active area, and the non-display area NDA may also be referred to as a non-active area. The display area DPA may usually occupy an inner region of the display device 1.

The non-display area NDA may be disposed around the display area DPA. The non-display area NDA may entirely or partially surround the display area DPA. The display area DPA may have a rectangular shape, and the non-display area NDA may be disposed adjacent to four sides of the display area DPA. The non-display area NDA may constitute a bezel of the display device 1. Lines or circuit drivers included in the display device 1 may be disposed in the non-display area NDA, or external devices may be mounted in the non-display area NDA.

The display area DPA may include a plurality of pixels PX. Each of the pixel PXs may include one or more light-emitting elements that emit light in a specific wavelength band to display a specific color. In some embodiments, the plurality of pixels PX may be arranged in a matrix form. For example, the plurality of pixels PX may be arranged along the first direction X and the second direction Y. A shape of each pixel PX may be a rectangular or square shape in a plan view. However, the present disclosure is not limited thereto. A shape of each pixel PX may be a rhombus shape having each shape inclined with respect to one direction. Hereinafter, an example in which the pixel PX has a rectangular shape in a plan view is described. The present disclosure is not limited thereto.

Each pixel PX may include a plurality of sub-pixels SPX1, SPX2, and SPX3. A plurality of sub-pixels SPX1, SPX2, and SPX3 included in each pixel PX may be arranged in a stripe type. The plurality of sub-pixels SPX1, SPX2, and SPX3 of each pixel PX may be arranged in a direction perpendicular to a direction in which each of the plurality of sub-pixels SPX1, SPX2, and SPX3 extends. For example, the plurality of sub-pixels SPX1, SPX2, and SPX3 included in each pixel PX may be arranged in the first direction X, while each of the plurality of sub-pixels SPX1, SPX2, and SPX3 may extend in the second direction Y.

Figure 3:
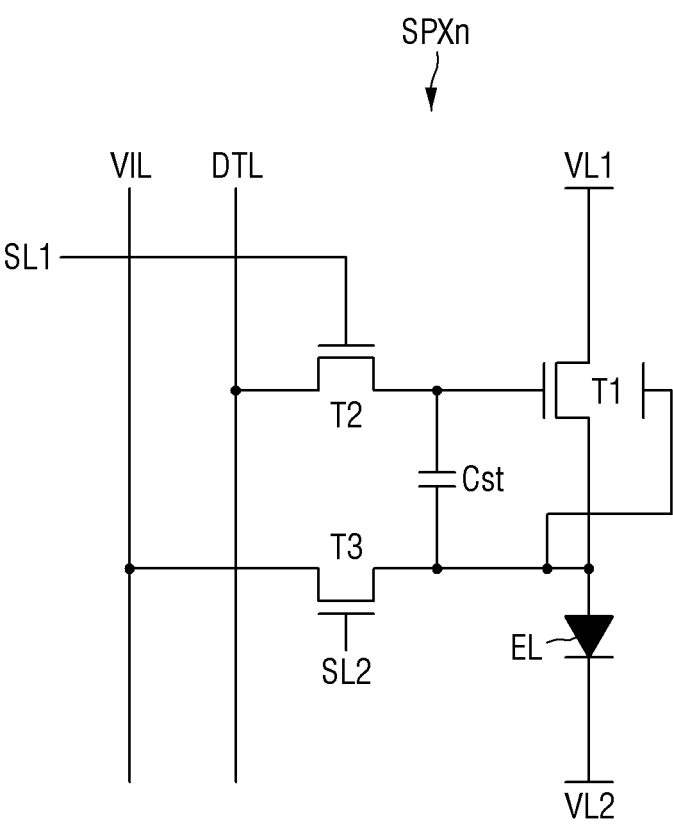
FIG. 3 is an equivalent circuit diagram of one sub-pixel according to one embodiment.

FIG. 3 is an equivalent circuit diagram of one sub-pixel according to one embodiment.

Referring to FIG. 3, each sub-pixel SPXn of the display device 1 according to one embodiment includes a light-emitting diode EL, three transistors T1, T2, and T3 and one storage capacitor Cst.

The light-emitting diode EL emits light according to a current supplied through a first transistor T1. The light-emitting diode EL includes a first electrode, a second electrode, and at least one light-emitting element disposed therebetween. The light-emitting element may emit light of a specific wavelength based on an electrical signal transmitted from the first electrode and the second electrode. The first electrode of the light-emitting element may act as a pixel electrode as an anode, while the second electrode may act as a common electrode as a cathode. The present disclosure is not limited thereto. Conversely, the first electrode may act as a common electrode as a cathode, and the second electrode may act as a pixel electrode as an anode.

One end of the light-emitting diode EL may be connected to a source electrode of the first transistor T1, while the opposite end thereof may be connected to a second power line VL2 to which a low-potential voltage (second power voltage) lower than a high-potential voltage (first power voltage) of a first power line VL1 is supplied. Further, the opposite end of the light-emitting diode EL may be connected to a source electrode of a second transistor T2.

The first transistor T1 adjusts current flowing from the first power line VL1 to which the first power voltage is supplied to the light-emitting diode EL based on a voltage difference between voltages of a gate electrode and the source electrode of the first transistor T1. In one example, the first transistor T1 may act as a driving transistor for driving the light-emitting diode EL. The gate electrode of the first transistor T1 may be connected to the source electrode of the second transistor T2, the source electrode thereof may be connected to the first electrode of the light-emitting diode EL, a drain electrode thereof may be connected to the first power line VL1 to which the first power voltage is applied, and an auxiliary electrode thereof may be connected to one end of the light-emitting diode EL or a source electrode of a third transistor T3.

The second transistor T2 may be turned on based on a scan signal of a first scan line SL1 to connect a data line DTL to the gate electrode of the first transistor T1. A gate electrode of the second transistor T2 may be connected to the first scan line SL1, the source electrode thereof may be connected to the gate electrode of the first transistor T1, and a drain electrode thereof may be connected to the data line DTL.

The third transistor T3 may be turned on based on a scan signal of a second scan line SL2 to connect an initialization power line VIL to one end of the light-emitting diode EL. A gate electrode of the third transistor T3 may be connected to the second scan line SL2, a drain electrode thereof may be connected to the initialization power line VIL, and the source electrode thereof may be connected to one end of the light-emitting diode EL or the source electrode of the first transistor T1. The second transistor T2 and the third transistor T3 may be simultaneously turned on based on the same scan signal.

In one embodiment, the source electrode and the drain electrode of each of the transistors T1, T2, and T3 are not limited to the above configuration. That is, the source electrode and the drain electrode of each of the transistors T1, T2, and T3 may have a configuration opposite to the above configuration. Further, each of the transistors T1, T2, and T3 may be embodied as a thin-film transistor. Further, in FIG. 3, a case in which each of the transistors T1, T2, and T3 is embodied as an N-type MOSFET (Metal Oxide Semiconductor Field Effect Transistor) is shown. The present disclosure is not limited thereto. That is, each of the transistors T1, T2, and T3 may be embodied as a P-type MOSFET. Alternatively, some thereof may be embodied as an N-type MOSFET, and the other thereof a may be embodied as a P-type MOSFET.

The storage capacitor Cst is disposed between the gate electrode and the source electrode of the first transistor T1. The storage capacitor Cst stores therein a difference voltage between a gate voltage and a source voltage of the first transistor T1.

Descriptions of a transistor to be described later is based on the first transistor T1. However, the present disclosure is not limited thereto. The descriptions of the transistor to be described later may also be applied to the second and third transistors T2 and T3.

Figure 5:
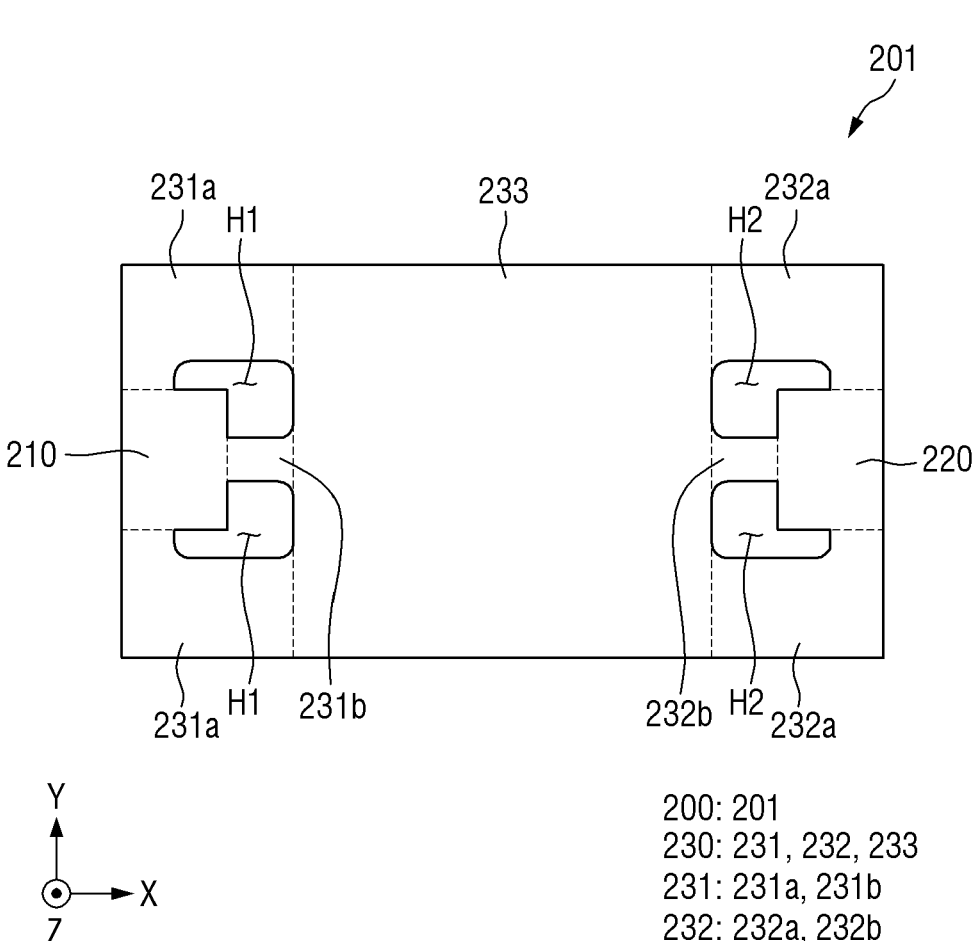
FIG. 5 is a plan view of a semiconductor pattern included in the transistor of FIG. 4.
Figure 7:
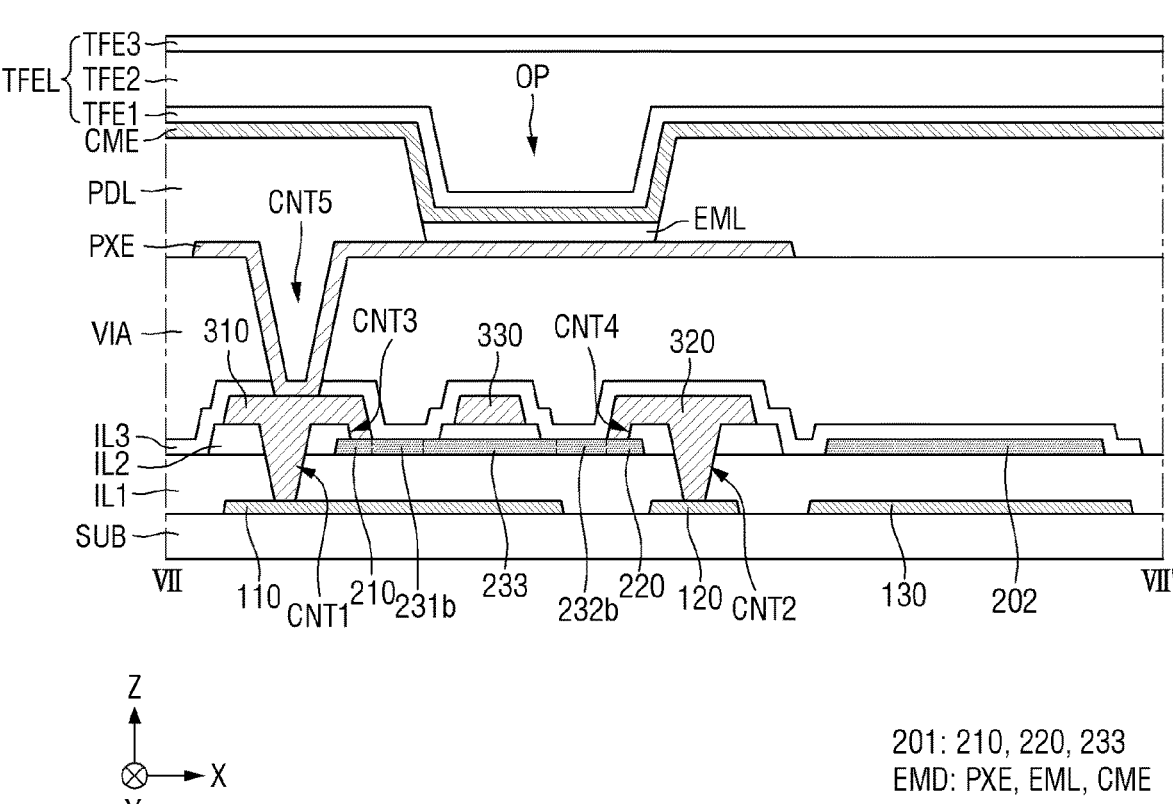
FIG. 7 is a cross-sectional view taken along a line VII-VII' of FIG. 4.
Figure 8:
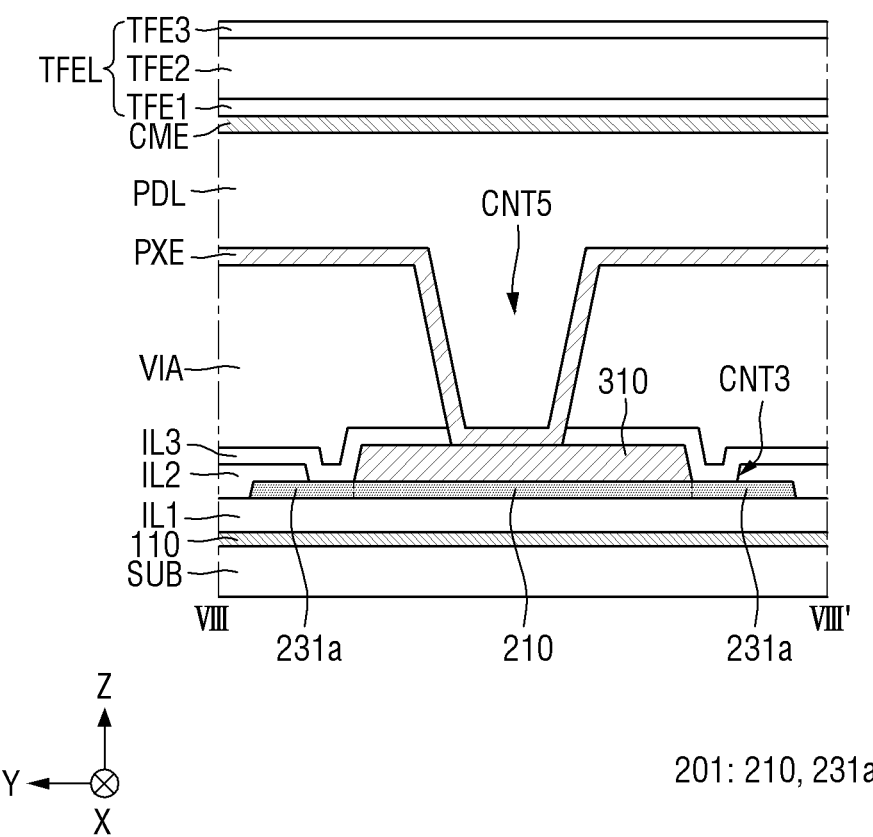
FIG. 8 is a cross-sectional view taken along a line VIII-VIII' in FIG. 4.
Figure 9:
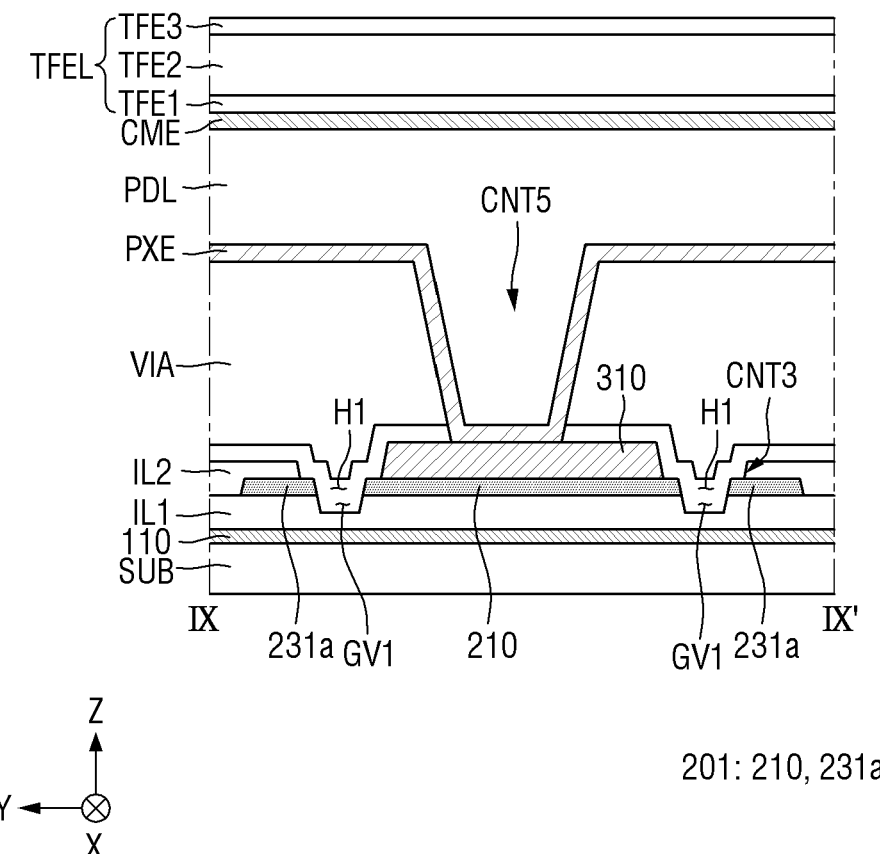
FIG. 9 is a cross-sectional view taken along a line IX-IX' of FIG. 4.

FIG. 4 is a plan view of a transistor included in the display device 1 according to one embodiment. FIG. 5 is a plan view of an active pattern 201 included in the transistor of FIG. 4. FIG. 6 is a cross-sectional view taken along a line VI-VI' of FIG. 4. FIG. 7 is a cross-sectional view taken along a line VII-VII' of FIG. 4. FIG. 8 is a cross-sectional view taken along a line VIII-VIII' in FIG. 4. FIG. 9 is a cross-sectional view taken along a line IX-IX' of FIG. 4. FIG. 10 is a cross-sectional view taken along a line X-X' in FIG. 4.

Referring to FIGS. 4, 5, 6, 7, 8, 9, and 10, the display device 1 according to one embodiment may include a substrate SUB, a first conductive layer 100 disposed on the substrate SUB, a first insulating layer IL1 disposed on the first conductive layer 100, a semiconductor layer 200 disposed on the first insulating layer ILL a second insulating layer IL2 disposed on the semiconductor layer 200, a second conductive layer 300 disposed on the second insulating layer IL2, a third insulating layer IL3 disposed on the second conductive layer 300, an via layer VIA disposed on the third insulating layer IL3, a pixel electrode PXE disposed on the via layer VIA, a pixel defining layer PDL disposed on the pixel electrode PXE and an opening OP defined in the pixel defining layer PDL, a light-emitting layer EML disposed within the opening OP of the pixel defining layer PDL, a common electrode CME disposed on the light-emitting layer EML, and a thin-film encapsulation layer TFEL disposed on the common electrode CME.

The substrate SUB may support the layers disposed thereon. The substrate SUB may be an insulating substrate SUB. For example, the substrate SUB may be made of a material such as polymer resin or glass.

The first conductive layer 100 may be disposed on the substrate SUB. The first conductive layer 100 may include a first pattern 110, a second pattern 120, and a first storage pattern 130.

The first pattern 110 may be a light-blocking pattern. The first pattern 110 may prevent external light from being irradiated to a third area 230 of the active pattern 201, thereby preventing photocurrent from flowing in the third area 230. The first pattern 110 may overlap a first area 210, a first sub-area 231, and a third sub-area 233 of the active pattern 201. Further, the first pattern 110 may partially overlap a second sub-area 232 of the active pattern 201. The first pattern 110 may overlap a first hole H1 of the active pattern 201 and may partially overlap a second hole H2 of the active pattern 201.

The first pattern 110 may be spaced apart from the second pattern 120 in the first direction X. The first pattern 110 may at least partially overlap a third electrode 330. The first pattern 110 may be connected to a first electrode 310 via a first contact hole CNT1 penetrating through the first insulating layer IL1 and the second insulating layer IL2. The first pattern 110 may partially overlap an opposite end of the second electrode 320 in the first direction X. In this connection, the first electrode 310 may mean a drain electrode of the first transistor T1, the second electrode 320 may mean a source electrode of the first transistor T1. However, the disclosure is not limited thereto. Conversely, the first electrode 310 may mean a source electrode of the first transistor T1, and the second electrode 320 may mean a drain electrode of the first transistor T1.

An electrical signal may be applied to the second pattern 120. The second pattern 120 may have a shape extending in the second direction Y. The second pattern 120 may be disposed between the first pattern 110 and the first storage pattern 130.

Specifically, the first storage pattern 130 may be spaced apart from the second pattern 120 in the first direction X, and the second pattern 120 may be disposed between the first pattern 110 and the first storage pattern 130 in the first direction X. That is, the first pattern 110 is located at one end of the second pattern 120, and the first storage pattern 130 is located at the other end of the second pattern 120 in the first direction X.

The second pattern 120 may partially overlap the second electrode 320. The second pattern 120 may be connected to the second electrode 320 via a second contact hole CNT2 penetrating through the first insulating layer IL1 and the second insulating layer IL2.

When a plan view shown in FIG. 4 illustrates the first transistor T1 of FIG. 3, the second pattern 120 may act as the first power line VL1.

The first storage pattern 130 together with a second storage pattern 202 of the semiconductor layer 200 to be described later may constitute the storage capacitor Cst. The first storage pattern 130 may overlap the second storage pattern 202. The first insulating layer IL1 may be disposed between the first storage pattern 130 and the second storage pattern 202.

The first conductive layer 100 may include one or more metals selected among from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu).

The first insulating layer IL1 may be disposed on the first conductive layer 100. The first insulating layer IL1 may receive therein the first contact hole CNT1 interconnecting the first pattern 110 and the first electrode 310 to each other, the second contact hole CNT2 interconnecting the second pattern 120 and the second electrode 320 to each other, a first groove GV1 overlapping with and spatially connected to the first hole H1, and a second groove GV2 overlapping with and spatially connected to the second hole H2.

Each of the first and second grooves GV1 and GV2 may have a structure in which a portion of the first insulating layer IL1 is partially etched so that a top face thereof is depressed in a direction opposite to the third direction Z. In other words, the first groove GV1 may be formed by recessing a portion of the first insulating layer IL1 exposed through the first hole H1 toward the substrate SUB. The second groove GV2 may be formed by recessing a portion of the first insulating layer IL1 exposed through the second hole H1 toward the substrate SUB.

The first hole H1 is located on a top face of the first groove GV1. The second hole H2 may be located on a top face of the second groove GV2.

The first insulating layer IL1 may include silicon oxide, silicon nitride, silicon oxynitride, aluminum oxide, tantalum oxide, hafnium oxide, zirconium oxide, titanium oxide, and the like alone or in combination with each other.

The semiconductor layer 200 may be disposed on the first insulating layer IL1. The semiconductor layer 200 may include the active pattern 201 and the second storage pattern 202. The semiconductor layer 200 may be made of polycrystalline silicon, single crystal silicon, or amorphous silicon.

The active pattern 201 may include the first area 210, a second area 220, and a third area 230. A first area 210 maybe located at an opposite side in the first direction X and in the active pattern 201. A second area 220 may be located at one side in the first direction X and in the active pattern 201. The third area 230 may be located between the first area 210 and the second area 220 and in the active pattern 201. A plurality of the first holes H1 and a plurality of the second holes H2 are defined in the active pattern 201, which partially expose the first insulating layer IL1.

The first area 210 may be a portion of the active pattern 201 in contact with the first electrode 310. The first area 210 may be connected to the first electrode 310 via a third contact hole CNT3 penetrating through the second insulating layer IL2. A planar shape of the first area 210 may be defined by a planar shape of a portion of the first electrode 310 overlapping the active pattern 201. In some embodiments, the planar shape of the first area 210 may be rectangular. For example, the first area 210 may have a short side extending in the first direction X and a long side extending in the second direction Y. The present disclosure is not limited thereto.

The second area 220 may be a portion of the active pattern 201 in contact with the second electrode 320. The second area 220 may be connected to the second electrode 320 via a fourth contact hole CNT4 penetrating through the second insulating layer IL2. A planar shape of the second area 220 may be defined by a planar shape of a portion of the second electrode 320 overlapping the active pattern 201. In some embodiments, the planar shape of the second area 220 may be rectangular. For example, the second area 220 may have a short side extending in the first direction X and a long side extending in the second direction Y. The present disclosure is not limited thereto. The planar shape of the second area 220 may be substantially the same as the planar shape of the first area 210.

Each of the first and second areas 210 and 220 may include a multiple of carrier ions and thus have higher conductivity and lower electrical resistance than those of the third area 230.

The third area 230 may include a first sub-area 231, a second sub-area 232, and a third sub-area 233. The third sub-area 233 may be located in a middle area of the active pattern 201. The third sub-area 233 may be located between the first hole H1 and the second hole H2. Further, the third sub-area 233 may be located between the first sub-area 231 and the second sub-area 232.

The first sub-area 231 may be located between the first area 210 and the third sub-area 233. The first sub-area 231 may be located around the first holes H1. The first sub-area 231 may include a first-first sub-area 231a and a first-second sub-area 231b.

The first-first sub-area 231a may be disposed adjacent to an edge of the active pattern 201, and may connect one end and the other end in the second direction Y of the first area 210 to the third sub-area 233. For example, a portion of the first-first sub-area 231a connecting one end in the second direction Y of the first area 210 to the third sub-area 233 may be located on one side in the second direction Y of the first hole H1. The other portion of the first-first sub-area 231a connecting the other end in the second direction Y of the first area 210 to the third sub-area 233 may be located on the other side in the second direction Y of the first hole H1. In this connection, the term "connecting" may mean providing a current flow path in which electrical current flows.

The first-second sub-area 231b may be positioned between the plurality of first holes H1. The first-second sub-area 231b may be located on an opposite side in the first direction X of the third sub-area 233, and may be located on one side in the first direction X of the first area 210. The first-second sub-area 231b may connect one end in the first direction X of the first area 210 to the third sub-area 233. The first-second sub-area 231b may be surrounded by the plurality of first holes H1, the first area 210, and the third sub-area 233.

The first-second sub-area 231b may not overlap the first groove GV1. An edge of the first-second sub-channel area 231b may be aligned with an edge of the first groove GV1.

That is, the display device 1 according to one embodiment may include the plurality of first holes H1 so that the first sub-area 231 may include the first-first sub-area 231a and the first-second sub-area 231b. Therefore, the first sub-area 231 including the first-first sub-area 231a and the first-second sub-area 231b acting as a plurality of current flow paths may allow the electrical resistance generated between the first area 210 and the third sub-area 233 to be reduced. In other words, as shown by an arrow in FIG. 4, the first-second sub-area 231b may serve as a current flow path along which current flows. When the plurality of first holes H1 are formed, the first-second sub-area 231b acting as a current flow path along which the current flows may be formed, thereby preventing the active pattern 201 from being damaged which may otherwise occur due to increase in a stress caused by current or voltage or at a high current situation.

The second sub-area 232 may be located between the second area 220 and the third sub-area 233. The second sub-area 232 may be located around the second holes H2. The second sub-area 232 may include a second-first sub-channel area 232a and a second-second sub-channel area 232b. The second-first sub-channel area 232a may be disposed adjacent to an edge of the active pattern 201, and may connect one end and the other end in the second direction Y of the second area 220 to the third sub-area 233. For example, a portion of the second-first sub-channel area 232a connecting one end in the second direction Y of the second area 220 to the third sub-area 233 may be located atone side in the second direction Y around the second hole H2. The other portion of the second-first sub-channel area 232a connecting the other end in the second direction Y of the second area 220 to the third sub-area 233 may be located at the other side in the second direction Y around the second hole H2.

The second-second sub-channel area 232b may be positioned between the plurality of second holes H2. The second-second sub-channel area 232b may be located on one side in the first direction X of the third sub-area 233, and may be located on the other side in the first direction X of the second area 220. The second-second sub-channel area 232*b* may connect the other end in the first direction X of the second area 220 to the third sub-area 233. The second-second sub-channel area 232*b* may be surrounded by the plurality of second holes H2, the second area 220, and the third sub-area 233.

The second-second sub-channel area 232*b* may not overlap the second groove GV2. An edge of the second-second sub-channel area 232*b* may be aligned with an edge of the second groove GV2.

That is, the display device 1 according to one embodiment may include the plurality of second holes H2 so that the second sub-area 232 may include the second-first sub-channel area 232*a* and the second-second sub-channel area 232*b*. Accordingly, the second sub-area 232 including the second-first sub-channel area 232*a* and the second-second sub-channel area 232*b* acting as a plurality of current flow paths may allow the electrical resistance generated between the second area 220 and the third sub-area 233 to be reduced. In other words, as shown by an arrow in FIG. 4, the second-second sub-area 232*b* may serve as a current flow path along which current flows. When the plurality of second holes H2 are formed, the second-second sub-area 232*b* acting as a current flow path along which the current flows may be formed, thereby preventing the active pattern 201 from being damaged which may otherwise occur due to increase in a stress caused by current or voltage or at a high current situation.

In some embodiments, each of the first hole H1 and the second hole H2 may include a plurality of holes. For example, each of the first hole H1 and the second hole H2 may include two holes which may be arranged in the second direction Y. Each of the first holes H1 may surround each of two corners at one side in the first direction X of the first area 210. Each of the second holes H2 may surround each of two corners at an opposite side in the first direction X of the second area 220.

An edge of the first hole H1 partially surrounding the first area 210 may be aligned with an edge of the first electrode 310. An edge of the second hole H2 partially surrounding the second area 220 may be aligned with an edge of the second electrode 320.

A planar shape of each of the first hole H1 and the second hole H2 may be a rectangular shape in which one corner is recessed. For example, the planar shape of each of the first hole H1 and the second hole H2 may have a shape of 'L'. The planar shape of the first hole H1 and the planar shape of the second hole H2 may have a symmetric structure with each other around an imaginary line that bisects the active pattern 201 and extends in the second direction Y. The planar shapes of two first holes H1 may have a symmetric structure with each other around an imaginary line that bisects the active pattern 201 and extends in the first direction X. Further, the planar shapes of two second holes H2 may have a symmetrical structure with each other around an imaginary line that bisects the active pattern 201 and extends in the first direction X.

The second storage pattern 202 may be located at one side in the first direction X around the active pattern 201. The second storage pattern 202 may be made of conductive polycrystalline silicon, single crystal silicon, or amorphous silicon. The second storage pattern 202 may overlap the first storage pattern 130. The second storage pattern 202 together with the first storage pattern 130 may constitute the storage capacitor Cst. In some embodiments, the second storage pattern 202 may be located at one side in the first direction X around the second pattern 120 on a plan view.

The second insulating layer IL2 may be disposed on the semiconductor layer 200.

The first contact hole CNT1 interconnecting the first pattern 110 and the first electrode 310 to each other, the second contact hole CNT2 interconnecting the second pattern 120 and the second electrode 320 to each other, the third contact hole CNT3 interconnecting the first area 210 of the active pattern 201 and the first electrode 310 to each other, and a fourth contact hole CNT4 interconnecting the second area 220 of the active pattern 201 and the second electrode 320 to each other may be formed in the second insulating layer IL2.

As described above, the first contact hole CNT1 and the second contact hole CNT2 may penetrate through not only the second insulating layer IL2 but also the first insulating layer IL1.

The third contact hole CNT3 may overlap and be spatially connected to the first hole H1 in the active pattern 201 and the first groove GV1 in the first insulating layer IL1. The fourth contact hole CNT4 may overlap and be spatially connected to the second hole H2 in the active pattern 201 and the second groove GV2 in the first insulating layer IL1. The third contact hole CNT3 may be located between the first groove GV1 and the first contact hole CNT1. The fourth contact hole CNT4 may be positioned between the second groove GV2 and the second contact hole CNT2.

The second conductive layer 300 may be disposed on the second insulating layer IL2. The second conductive layer 300 may include the first electrode 310, the second electrode 320, and the third electrode 330.

The first electrode 310 may overlap the first pattern 110. The first electrode 310 may be connected to the first pattern 110 via the first contact hole CNT1 penetrating through the first and second insulating layers IL1 and IL2. Although not shown, the first electrode 310 may be connected to the pixel electrode. The first electrode 310 may partially overlap the active pattern 201. Specifically, the first electrode 310 may overlap the first area 210 of the active pattern 201. The first electrode 310 may be connected to the first area 210 via the third contact hole CNT3 penetrating through the second insulating layer IL2.

The first electrode 310 may have a rectangular planar shape. For example, the planar shape of the first electrode 310 may be a rectangular shape including a long side extending in the first direction X and a short side extending in the second direction Y.

The second electrode 320 may partially overlap the second pattern 120. The second electrode 320 may be connected to the second pattern 120 via the second contact hole CNT2 penetrating through the first and second insulating layers IL1 and IL2. The second electrode 320 may partially overlap the active pattern 201. Specifically, the second electrode 320 may overlap the second area 220 of the active pattern 201. The second electrode 320 may be connected to the second area 220 via the fourth contact hole CNT4 penetrating through the second insulating layer IL2.

The second electrode 320 may have a rectangular planar shape. For example, the planar shape of the second electrode 320 may be a rectangular shape including a long side extending in the first direction X and a short side extending in the second direction Y. The planar shape of the second electrode 320 may be substantially the same as the planar shape of the first electrode 310.

The third electrode 330 may be positioned between the first electrode 310 and the second electrode 320. The third electrode 330 may act as the gate electrode of the first transistor in FIG. 3. Specifically, the third electrode 330 may be located at one side in the first direction X around the first electrode 310, and may be located at an opposite side in the first direction X around the second electrode 320. A gate signal for driving the transistor T1 may be applied to the third electrode 330. In some embodiments, the third electrode 330 may have a shape extending in the second direction Y.

The third electrode 330 may partially overlap the active pattern 201. Specifically, the third electrode 330 may entirely overlap the third sub-area 233 of the active pattern 201. The third electrode 330 may be positioned between the first hole H1 and the second hole H2 of the active pattern 201 in a plan view.

Further, the third electrode 330 may be positioned between the first groove GV1 and the second groove GV2, and may at least partially overlap the first pattern 110.

The second conductive layer 300 may include one or more metals selected among from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu).

The third insulating layer IL3 may be disposed on the second conductive layer 300. The third insulating layer IL3 may be disposed over an entire area of the substrate SUB.

The via layer VIA may be disposed on the third insulating layer IL3. The via layer VIA may be disposed on the second conductive layer 300 to entirely cover the top face of the third insulating layer IL3. When the via layer VIA is embodied as an organic film, a top face thereof may be partially planarized despite a step at a bottom face thereof.

The via layer VIA may include an organic insulating material such aspolyacrylates resin, epoxy resin, phenolic resin, polyamides resin, polyimides rein, unsaturated polyesters resin, poly phenyleneethers resin, polyphenylenesulfides resin or benzocyclobutene (BCB).

The pixel electrode PXE may be disposed on the via layer VIA. The pixel electrode PXE may act as an anode. The pixel electrode PXE may be electrically connected to the first electrode 310 via a fifth contact hole CNT5 penetrating through the via layer VIA and the third insulating layer IL3.

For example, the pixel electrode PXE may have a stack structure of a first layer made of a material having a higher work function such as ITO (Indium-Tin-Oxide), IZO (Indium-Zinc-Oxide), ZnO(Zinc Oxide), $In_2O_3$(Indium Oxide), and a second layer made of a reflective material such as silver (Ag), magnesium (Mg), aluminum (Al), platinum (Pt), lead (Pb), gold (Au), nickel (Ni), neodymium (Nd), iridium (Ir), chromium (Cr), lithium (Li), calcium (Ca) or mixtures thereof.

The pixel defining layer PDL may be disposed on the pixel electrode PXE. The pixel defining layer PDL may have the opening OP defined therein that partially exposes the pixel electrode PXE. The pixel defining layer PDL may partially cover each of the pixel electrode PXE and the via layer VIA.

The pixel defining layer PDL may be made of an organic insulating material or an inorganic insulating material. For example, the pixel defining layer PDL may include at least one of polyimide-based resin, acrylic-based resin, a silicone compound, and polyacrylic-based resin.

The light-emitting layer EML may be disposed on a portion of the pixel electrode PXE exposed through the opening OP of the pixel defining layer PDL. At least a portion of the light-emitting layer EML may be disposed within the opening of the pixel defining layer PDL.

The light-emitting layer EML may include an organic material layer. The organic material layer includes an organic light-emitting layer, and may further include a hole injection/transport layer and an electron injection/transport layer.

The common electrode CME may be disposed on the light-emitting layer EML. The common electrode CME may be disposed over the entire area of the substrate SUB while covering all pixels PX. The common electrode CME may act as a cathode.

The pixel electrode PXE, the light-emitting layer EML and the common electrode CME may constitute the light-emitting element EMD. The light-emitting element EMD may be, for example, an organic light-emitting element.

In one embodiment, the thin-film encapsulation layer TFEL may be disposed on the common electrode CME. The thin-film encapsulation layer TFEL may include a first inorganic film TFE1, a first organic film TFE2 disposed on the first inorganic film TFE1, and a second inorganic film TFE3 disposed on the first organic film TFE2. Although not shown, the first inorganic film TFE1 and the second inorganic film TFE3 are in contact with each other at an end of the thin-film encapsulation layer TFEL so that the first organic film TFE2 may be sealed with the first inorganic film TFE1 and the second inorganic film TFE3.

Each of the first inorganic film TFE1 and the second inorganic film TFE3 may include silicon nitride, silicon oxide, or silicon oxynitride. The first organic film TFE2 may include an organic insulating material.

In the display device 1 according to one embodiment, the active pattern 201 may include the plurality of first holes H1 and the plurality of second holes H2. Accordingly, the first sub-area 231 may include the first-first sub-area 231a disposed outside the plurality of first holes H1 and not disposed therebetween and the first-second sub-area 231b disposed between adjacent ones of the plurality of first holes HE The second sub-area 232 may include the second-first sub-channel area 232a disposed outside the plurality of second holes H2 and not disposed therebetween, and the second-second sub-channel area 232b disposed between adjacent ones of the plurality of second holes H2.

The first area 210 and the third sub-area 233 may be connected to each other via the first sub-area 231 including the first-first sub-area 231a and the first-second sub-area 231b acting as the plurality of current flow paths. The second area 220 and the third sub-area 233 may be connected to each other via the second sub-area 232 including the second-first sub-channel area 232a and the second-second sub-channel area 232b acting as the plurality of current flow paths. Therefore, the first sub-area 231 and the second sub-area 232 as described may respectively allow the electrical resistance generated between the first area 210 and the third sub-area 233 and the electrical resistance generated between the second area 220 and the third sub-area 233 to be reduced.

FIG. 11 is a flowchart showing a method for manufacturing the display device 1 according to one embodiment. FIGS. 12, 13, 14, 15, and 16 are schematic diagrams showing the method for manufacturing the display device according to one embodiment.

Referring to FIGS. 11, 12, 13, 14, 15, and 16, first, the substrate SUB may be provided, the first conductive layer 100 may be disposed on the substrate SUB, the first insulating layer IL1p may be disposed on the first conductive layer 100, the active pattern 201p may be disposed on the first insulating layer IL1p, and the second insulating layer IL2p may be disposed on the active pattern 201p (S11).

In this connection, the substrate SUB, and the first conductive layer 100 may respectively be the same as the substrate SUB and the first conductive layer 100 included in the display device 1 as described above with reference to FIGS. 4, 5, 6, 7, 8, 9, and 10. Thus, descriptions thereof will be omitted. In this step, the first insulating layer IL1p and the second insulating layer IL2p are in a state in which various contact holes or grooves are not formed therein, and thus may be deformed via a process to be described later. Further, the active pattern 201p is in a state in which the first hole H1 and the second hole H2 is not formed therein, and thus may be deformed into the final active pattern 201 via a process to be described later.

Second, as shown in FIG. 13, the first contact hole CNT1 and the second contact hole CNT2 partially exposing the first conductive layer 100, and the third contact hole CNT3 and the fourth contact hole CNT4 partially exposing the active pattern 201 may be formed (S21).

A first mask pattern PR1 may be disposed on the second insulating layer IL2q. The first mask pattern PR1 may be disposed for an etching process such that an area covered with the first mask pattern PR1 may not be etched. The first mask pattern PR1 may be made of a positive type or negative type photoresist.

This step may act as a process of forming the first to fourth contact holes CNT1, CNT2, CNT3, and CNT4 via the etching process. The etching process of this step may be embodied as a dry etching process using gas. For example, the dry etching process of this step may be performed using a fluorine-based gas.

Each of the first contact hole CNT1 and the second contact hole CNT2 may penetrate through the first insulating layer IL1q and the second insulating layer IL2q. The first contact hole CNT1 may expose the first pattern 110, and the second contact hole CNT2 may expose the second pattern 120.

Each of the third contact hole CNT3 and the fourth contact hole CNT4 may penetrate through the second insulating layer IL2q. Each of the third contact hole CNT3 and the fourth contact hole CNT4 may partially expose the active pattern 20 1p. An area of the active pattern 201p exposed through each of the third contact hole CNT3 and the fourth contact hole CNT4 may be brought into a conductive stateusing the fluorine-based gas used in the dry etching process. In this step, after the etching process is finished, the first mask pattern PR1 may be removed.

Third, as shown in FIG. 14, the second conductive layer 300 partially exposing each of the third contact hole CNT3 and the fourth contact hole CNT4 may be formed on the second insulating layer IL2q, and the active pattern 201 may be partially etched to form the first holes H1 and the second holes H2 (S31).

This step may apply a second conductive material 300p on the second insulating layer IL2q, and may form a second mask pattern PR2 on the applied second conductive material 300p and then may etch the second conductive material 300p using the second mask pattern PR2.

The second mask pattern PR2 may be disposed for the etching process, such that an area covered with the second mask pattern PR2 may not be etched. The second mask pattern PR2 may be made of a positive type or negative type photoresist. The second mask pattern PR2 may be made of the same material as that of the first mask pattern PR1. The present disclosure is not limited thereto.

This step may act as a process of etching the second conductive material 300p to form the second conductive layer 300 that partially exposes each of the third contact hole CNT3 and the fourth contact hole CNT4. The etching process in this step may be embodied as a wet etching process using an etching solution reactive to the second conductive material 300p.

In this step, the etching solution may etch the active pattern 201 as well as the second conductive material 300p. Accordingly, the first holes H1 and the second holes H2 may be formed in the active pattern 201.

After this step, the active pattern 201 may be partially exposed through each of the third contact hole CNT3 and the fourth contact hole CNT4.

Fourth, the first groove GV1 and the second groove GV2 may be formed by partially etching the first insulating layer IL1q, as shown in FIG. 15 and FIG. 16 (S41).

This step may act as a process of partially removing the second insulating layer IL2q via an etching process. The etching process in this step may be embodied as a dry etching process using gas. For example, the dry etching process in this step may be performed using a fluorine-based gas. During the dry etching process, an area of the second insulating layer IL2q not covered with the second mask pattern PR2 may be partially removed. In this connection, an area of the active pattern 201 not covered with the second mask pattern PR2 may be brought into a conductive stateusing the etching gas used in the dry etching process. In other words, the area of the active pattern 201 that does not overlap with the second conductive layer 300 may be conductive.

In this step, the second mask pattern PR2 may be removed, and at the same time, each of the second insulating layer IL2q and the first insulating layer IL1q may be partially etched. Therefore, the first insulating layer IL1 subjected to this step may receive therein the first groove GV1 spatially connected to the first hole H1 and the second groove GV2 spatially connected to the second hole H2.

Thereafter, a process in which the second mask pattern PR2 is removed using a stripping scheme may be performed.

According to the method for manufacturing the display device 1 according to one embodiment, the display device 1 provided with the active pattern 201 including the plurality of first holes H1 and the plurality of second holes H2 may be manufactured. The active pattern 201 may include the third area 230 disposed between the plurality of first holes H1 and the plurality of second holes H2. The active pattern 201 may provide the plurality of current flow paths through which current may flow to reduce the electrical resistance of the third area 230. That is, according to the method for manufacturing the display device 1 according to one embodiment, the display device 1 in which the electrical resistance of the third area 230 of the transistor is reduced may be manufactured.

Hereinafter, a modified embodiment of the display device 1 will be described.

In the following embodiment, the description of the same configuration as that of the already described embodiment will be omitted or simplified. The description will be focused on differences therebetween.

Figure 19:
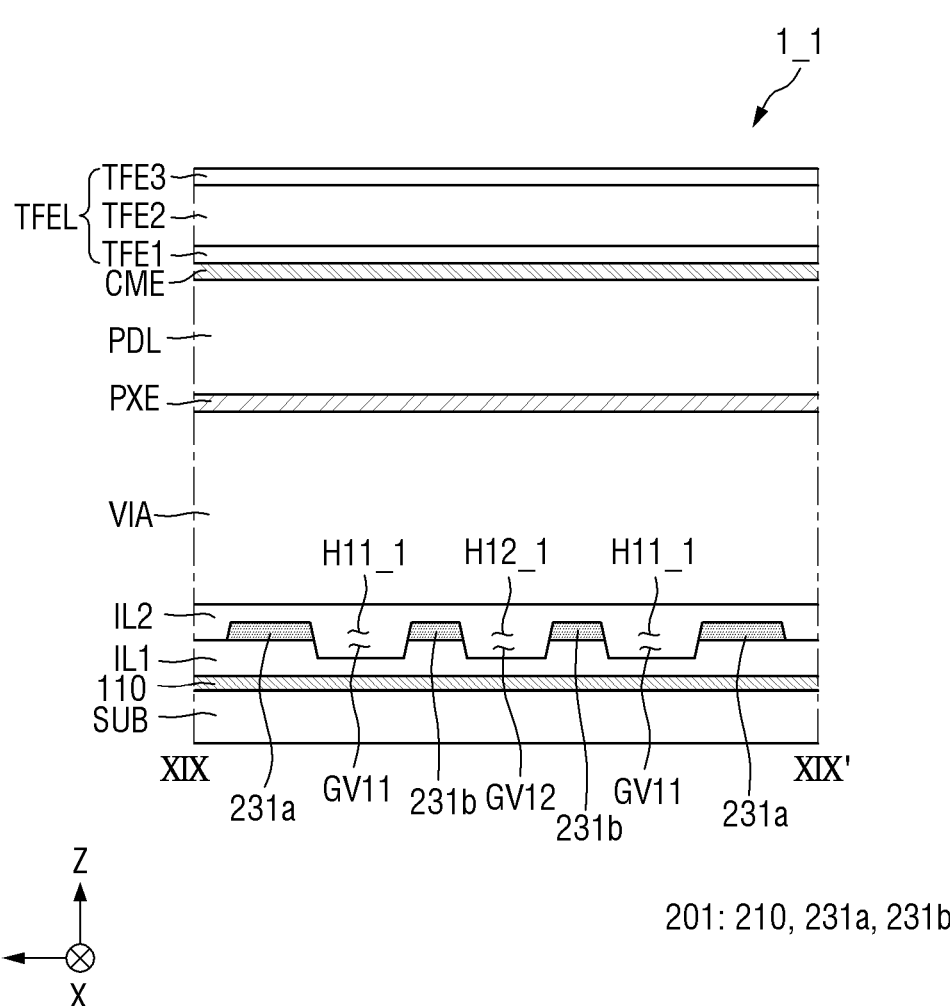
FIG. 19 is a cross-sectional view taken along a line XIX-XIX' of FIG. 17.

FIG. 17 is a plan view of a transistor included in the display device according to another embodiment. FIG. 18 is a plan view of a semiconductor pattern included in the transistor of FIG. 17. FIG. 19 is a cross-sectional view taken along a line XIX-XIX' of FIG. 17.

Referring to FIGS. 17, 18, and 19, a display device 1_1 according to this embodiment is different from the display device 1 according to one embodiment in that the former includes a plurality of second sub-channel areas 231*b*_1 and a plurality of fourth sub-channel areas 232*b*_1.

A semiconductor layer 200_1 included in the display device 1_1 according to this embodiment may include an active pattern 201_1 and the second storage pattern 202. In the active pattern 201_1 of this embodiment, the first hole H1 may include tow first sub-holes H11_1 and a second sub-hole H12_1. The two first sub-holes H11_1 may correspond to one end hole and the other end hole in the second direction Y among the plurality of first holes H1. The second sub-hole H12_1 may be disposed between the two first sub-holes H11_1. This embodiment illustrates that the first hole H1 includes one second sub-hole H12_1. However, the number of second sub-holes H12_1 included in the first hole H1 may not be limited thereto, and may be two or greater.

In this embodiment, each second sub-channel area 231*b*_1 may be defined as an area between each first sub-hole H11_1 and the second sub-hole H12_1. In another embodiment, when the number of the second sub-holes H12_1 is two or greater, the second sub-channel area 231*b*_1 may include each area between each first sub-hole H11_1 and each second sub-hole H12_1 and an area between the two second sub-holesH12_1.

Further, the first groove GV1 may include a first sub-groove GV11 over lapping and spatially connected to the first sub-hole H11_1 and a second sub-groove GV12 overlapping and spatially connected to the second sub-hole H12_1.

The second hole H2 defined in the active pattern 201_1 included in the display device 1_1 according to this embodiment may include two third sub-holes H21_1 and a fourth sub-holes H22_1. The two third sub-holes H21_1 may correspond to one end hole and the other end hole in the second direction Y among the plurality of second holes H2. The fourth sub-hole H22_1 may be disposed between the two third sub-holes H21_1. This embodiment illustrates that the second hole H2 includes one fourth sub-hole H22_1. The number of fourth sub-holes H22_1 included in the second hole H2 may not be limited thereto, and may be two or greater.

In this embodiment, each fourth sub-channel area 232*b*_i may be defined as an area between each third sub-hole H21_1 and the fourth sub-hole H22_1. In another embodiment, when the number of the fourth sub-holesH22_1 is two or greater, the fourth sub-channel area 232*b*_1 may include each area between each third sub-hole H21_1 and each fourth sub-hole H22_1 and an area between the two fourth sub-holes H22_1.

In the display device 1_1 according to this embodiment, the active pattern 201_1 may include the plurality of first holes H11_1 and H12_1 and the plurality of second holes H21_1 and H22_1. Accordingly, the first channel area 231_1 may include a plurality of first sub-channel areas 231*a* disposed outside the plurality of first holes H11_1 and H12_1 and not disposed between the plurality of first holes H11_1 and H12_1, and a plurality of second sub-channel areas231*b*_1, each second sub-channel areas 231*b*_1 being disposed between adjacent ones of the first holes H11_1 and H12_1. Further, the second channel area 232_1 may include a plurality of third sub-channel areas 232*a* disposed outside the plurality of second holes H21_1 and H22_1 and not disposed between the plurality of second holes H21_1 and H22_1, and a plurality of fourth sub-channel areas 232*b*_1, each fourth sub-channel areas 232*b*_1 being disposed between adjacent ones of the plurality of second holes H21_1 and H22_1.

The first area 210 and the third sub-area 233 may be connected to each other via the first channel area 231_1 including the first sub-channel areas 231*a* and the second sub-channel areas231*b*_1 acting as a plurality of current flow paths. The second area 220 and the third sub-area 233 may be connected to each other via the second channel area 232_1 including the third sub-channel areas 232*a* and the fourth sub-channel areas 232*b*_1 acting as a plurality of current flow paths. Accordingly, the first channel area 231_1 and the second channel area 232_1 as described above may respectively allow the electrical resistance generated between the first area 210 and the third sub-area 233 and the electrical resistance generated between the second area 220 and the third sub-area 233 to be reduced.

In addition, the display device 1_1 according to this embodiment may include the plurality of second sub-channel area 231*b*_1 and the plurality of fourth sub-channel area 232*b*_1. Accordingly, the electrical resistance generated between the first area 210 and the third sub-area 233 and the electrical resistance generated between the second area 220 and the third sub-area 233 may be further reduced.

Figure 20:
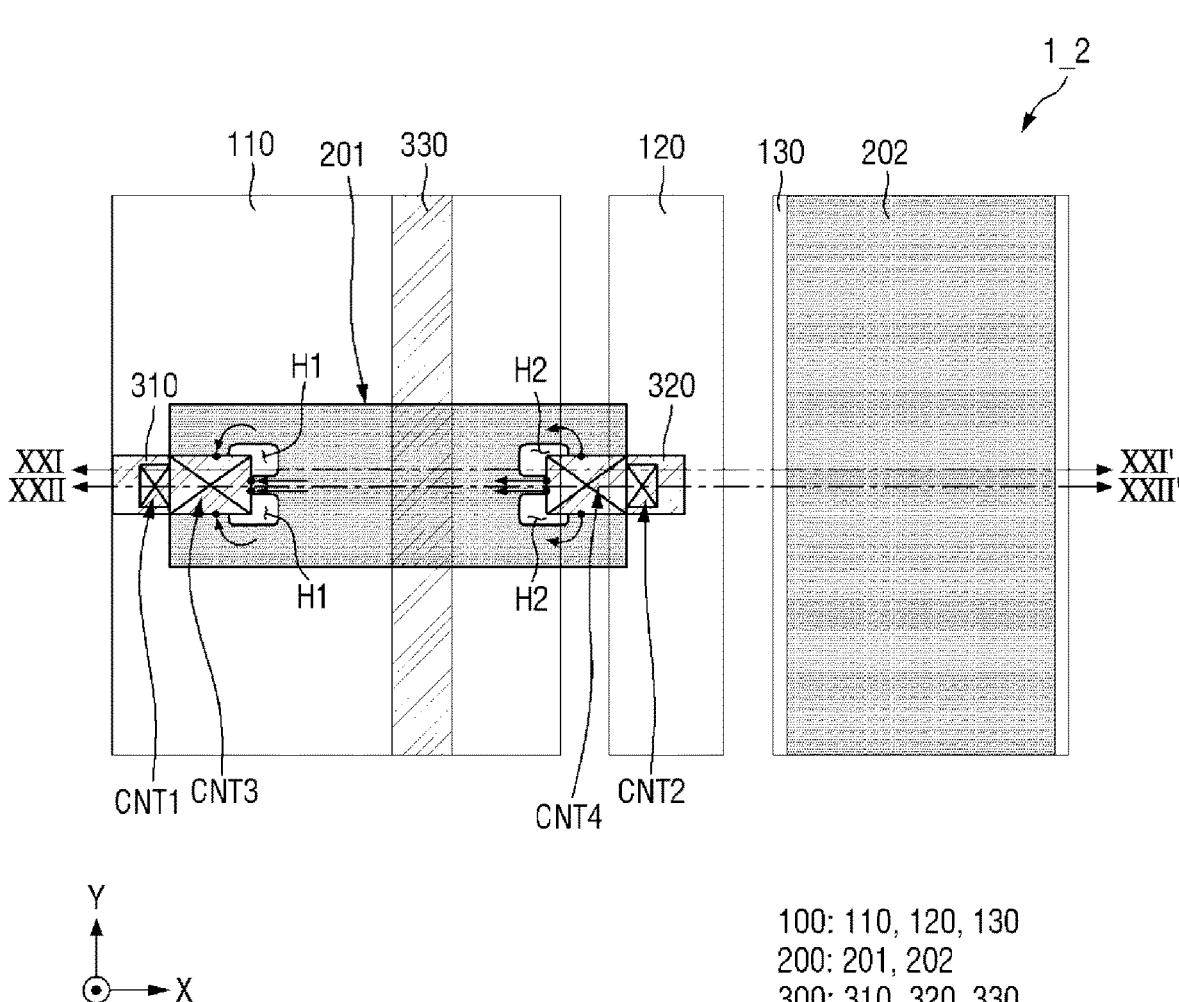
FIG. 20 is a plan view of a transistor included in a display device according to still another embodiment.
Figure 21:
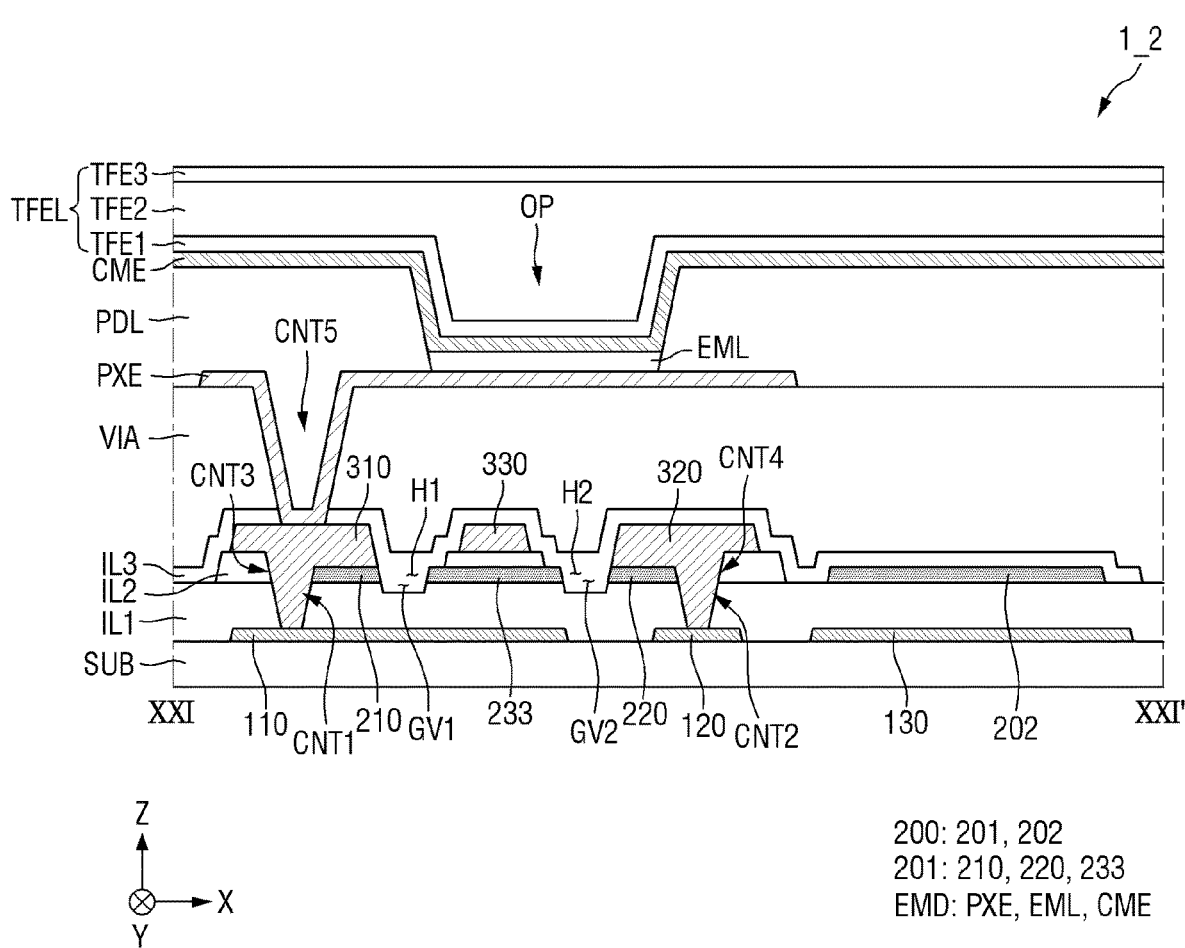
FIG. 21 is a cross-sectional view taken along a line XXI-XXI' in FIG. 20.
Figure 22:
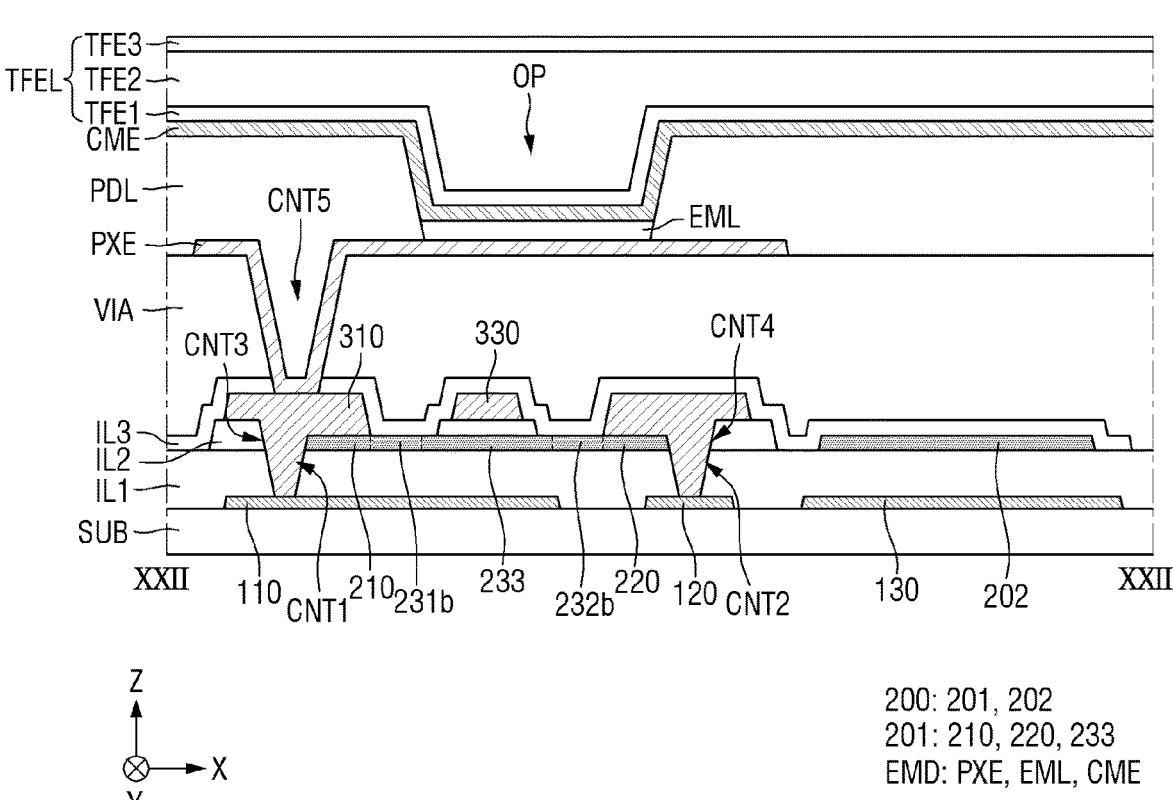
FIG. 22 is a cross-sectional view taken along a line XXII-XXII' of FIG. 20.

FIG. 20 is a plan view of a transistor included in a display device according to still another embodiment. FIG. 21 is a cross-sectional view taken along a line XXI-XXI' in FIG. 20. FIG. 22 is a cross-sectional view taken along a line XXII-XXII' of FIG. 20.

Referring to FIG. 20 to FIG. 22, a display device 1_2 according to this embodiment is different from the display device 1 according to one embodiment in that in the display device 1_2, the first contact hole CNT1, the third contact hole CNT3, the first hole H1 and the first groove GV1 may be spatially connected to each other, while the second contact hole CNT2, the fourth contact hole CNT4, the second hole H2, and the second groove GV2 are spatially connected to each other.

In this embodiment, an opposite end in the first direction X of the active pattern 201 may be exposed to the first contact hole CNT1. The second insulating layer IL2 may not be disposed between the opposite end in the first direction X of the active pattern 201 and the first contact hole CNT1. The first electrode 310 may be disposed to surround the opposite end in the first direction X of the active pattern 201. Specifically, the first electrode 310 may be in contact with a top face and a side face of the opposite end in the first direction X of the active pattern 201. Therefore, a contact area between the first electrode 310 and the first area 210 of the active pattern 201 may be maximized.

In this embodiment, one end in the first direction X of the active pattern 201 may be exposed to the second contact hole CNT2. The second insulating layer IL2 may not be disposed between one end in the first direction X of the active pattern 201 and the second contact hole CNT2. The second electrode 320 may be disposed to surround one end in the first direction X of the active pattern 201. Specifically, the second electrode 320 may contact a top face and a side face of one end in the first direction X of the active pattern 201. Accordingly, a contact area between the second electrode 320 and the second area 220 of the active pattern 201 may be maximized In the display device 1_2 according to this embodiment, the active pattern 201 may include the plurality of first holes H1 and the plurality of second holes H2. Accordingly, the first sub-area 231 may include first-first sub-areas 231*a* disposed outside the plurality of first holes H1 and not disposed between the plurality of first holes H1, and a first-second sub-area 231*b* disposed between the plurality of first holes HE The second sub-area 232 may include second-first sub-channel areas 232a disposed outside the plurality of second holes H2 and not disposed between the plurality of second holes H2, and a second-second sub-channel area 232b disposed between the plurality of second holes H2.

The first area 210 and the third sub-area 233 may be connected to each other via the first sub-area 231 including the first-first sub-areas 231a and the first-second sub-area 231b acting as a plurality of current flow paths. The second area 220 and the third sub-area 233 may be connected to each other via the second sub-area 232 including the second-first sub-channel areas 232a and the second-second sub-channel area 232b acting as a plurality of current flow paths. Therefore, the first sub-area 231 and the second sub-area 232 as described above may respectively allow the electrical resistance generated between the first area 210 and the third sub-area 233 and the electrical resistance generated between the second area 220 and the third sub-area 233 to be reduced.

In addition, in the display device 1_2 according to this embodiment, a contact area between the first electrode 310 and the first area 210 of the active pattern 201 and a contact area between the second electrode 320 and the second area 220 of the active pattern 201 may be maximized Thus, the electrical resistance between the first electrode 310 and the first area 210 of the active pattern 201 and the electrical resistance between the second electrode 320 and the second area 220 may be reduced.

What is claimed is:
1. A display device comprising:
a substrate;
a first insulating layer disposed on the substrate;
a semiconductor layer disposed on the first insulating layer, wherein the semiconductor layer includes an active pattern;
a second insulating layer disposed on the semiconductor layer; and
a first conductive layer disposed on the second insulating layer,
wherein the first conductive layer includes:
a first electrode in contact with the active pattern; and
a second electrode facing the first electrode and in contact with the active pattern,
wherein the active pattern includes:
a first area in contact with the first electrode;
a second area in contact with the second electrode;
a third area spaced apart from the first area and the second area and disposed between the first area and the second area;
a plurality of first holes disposed between the first area and the third area; and
a plurality of second holes disposed between the second area and the third area, and
wherein the first insulating layer includes:
a first groove overlapping the first hole and having a top face recessed toward the substrate; and
a second groove overlapping the second hole and having a top face recessed toward the substrate.
2. The device of claim 1, wherein a direction in which the plurality of first holes are arranged is a same as a direction in which the plurality of second holes are arranged.
3. The device of claim 2, wherein the third area includes:
a first sub-area disposed between first holes adjacent to each other among the plurality of first holes; and
a second sub-area disposed between second holes adjacent to each other among the plurality of second holes, wherein the first sub-area does not overlap the first groove, and wherein the second sub-area does not overlap the second groove.
4. The device of claim 3, wherein a portion of an edge of the first sub-area is aligned with an edge of the first groove, and
wherein a portion of an edge of the second sub-area is aligned with an edge of the second groove.
5. The device of claim 3, wherein the first sub-area includes a plurality of first sub-areas and the second sub-area includes a plurality of second sub-areas.
6. The device of claim 1, wherein the first electrode is in contact with the first area of the active pattern through a first contact hole penetrating the second insulating layer, and
wherein the second electrode is in contact with the second area of the active pattern through a second contact hole penetrating the second insulating layer.
7. The device of claim 6, wherein the device further includes a second conductive layer disposed between the substrate and the first insulating layer, and
wherein the second conductive layer includes a first pattern in contact with the first electrode, and a second pattern in contact with the second electrode.
8. The device of claim 7, wherein the first electrode and the first pattern contact each other through a third contact hole penetrating the first insulating layer and the second insulating layer, and
wherein the second electrode and the second pattern contact each other through a fourth contact hole penetrating the first insulating layer and the second insulating layer.
9. The device of claim 8, wherein the first contact hole is disposed between the first groove and the third contact hole, and
wherein the second contact hole spaced apart from the first contact hole is disposed between the second groove and the fourth contact hole.
10. The device of claim 8, wherein the first contact hole is spatially connected to the third contact hole, and
wherein the second contact hole spaced apart from the first contact hole is spatially connected to the fourth contact hole.
11. The device of claim 7, wherein the second conductive layer further includes a first storage pattern spaced apart from the second pattern, and
wherein the semiconductor layer includes a second storage pattern at least partially overlapping the first storage pattern.
12. The device of claim 6, wherein the first contact hole is spatially connected to the first groove, and
wherein the second contact hole is spatially connected to the second groove.
13. A display device comprising:
a substrate;
an active pattern disposed on the substrate;
an insulating layer disposed on the active pattern;
a first electrode disposed on the substrate and partially overlapping the active pattern; and
a second electrode disposed on the substrate and facing to the first electrode, wherein the second electrode partially overlaps the active pattern; and
a gate electrode disposed on the active pattern and disposed between the first electrode and the second electrode,
wherein the active pattern includes:
a plurality of first holes, wherein a portion of an edge of each of the plurality of first holes is aligned with an edge of the first electrode; and a plurality of second holes, wherein a portion of an edge of each of the plurality of second holes is aligned with an edge of the second electrode, and wherein the first electrode, the second electrode and the gate electrode are disposed on a top surface of the insulating layer.

14. The device of claim 13, wherein a direction in which the plurality of first holes are arranged is a same as a direction in which the plurality of second holes are arranged.

15. The device of claim 14, wherein the insulating layer is disposed between the active pattern and the first electrode, and wherein the first electrode is in contact with the active pattern through a first contact hole penetrating the insulating layer.

16. The device of claim 15, wherein the device further includes a second insulating layer disposed between the substrate and the active pattern, and wherein the second insulating layer includes:

a first groove overlapping the first hole and having a top face recessed toward the substrate; and a second groove overlapping the second hole and having a top face recessed toward the substrate.

17. The device of claim 13, wherein the active pattern further includes a first area overlapping the first electrode, a second area overlapping the second electrode, and a third area spaced apart from the first area and the second area and disposed between the first area and the second area, wherein the plurality of first holes are disposed between the first area and the third area, and wherein the plurality of second holes are disposed between the second area and the third area.

18. The device of claim 17, wherein the third area includes:

a first sub-area disposed between first holes adjacent to each other among the plurality of first holes; and a second sub-area disposed between second holes adjacent to each other among the plurality of second holes.

19. The device of claim 18, wherein the first sub-area includes a plurality of first sub-areas and the second sub-area includes a plurality of second sub-areas.

20. The device of claim 13, wherein the first electrode and the second electrode are composed of a same conductive layer.

* * * * *